United States Patent
Binninger et al.

(10) Patent No.: US 12,395,148 B2
(45) Date of Patent: Aug. 19, 2025

(54) DOUBLE-MODE SURFACE-ACOUSTIC-WAVE (DMS) FILTER HAVING A TRANSITION REGION WITH A PARTLY UNIFORM GEOMETRIC PROPERTY

(71) Applicant: RF360 Singapore Pte. Ltd., Singapore (SG)

(72) Inventors: Charles Binninger, Saint-Jeannet (FR); Jacques-Antoine Damy, Nice (FR); Aimeric Bisognin, Antibes (FR); Xavier Perois, Mouans Sartoux (FR)

(73) Assignee: RF360 Singapore Pte. Ltd., Republic Plaza (SG)

( * ) Notice: Subject to any disclaimer, the term of this patent is extended or adjusted under 35 U.S.C. 154(b) by 268 days.

(21) Appl. No.: 18/069,050

(22) Filed: Dec. 20, 2022

(65) Prior Publication Data

US 2024/0204747 A1    Jun. 20, 2024

(51) Int. Cl.
*H03H 9/145* (2006.01)
*H03H 3/08* (2006.01)
*H03H 9/64* (2006.01)

(52) U.S. Cl.
CPC .......... *H03H 9/14544* (2013.01); *H03H 3/08* (2013.01); *H03H 9/6433* (2013.01)

(58) Field of Classification Search
CPC .................. H03H 9/14544; H03H 9/6433
See application file for complete search history.

(56) References Cited

U.S. PATENT DOCUMENTS

| | | | |
|---|---|---|---|
| 8,994,479 B2 | 3/2015 | Shimozono | |
| 10,389,391 B2 | 8/2019 | Ito et al. | |
| 2004/0066254 A1* | 4/2004 | Shibahara | H03H 9/0038 333/195 |
| 2004/0108918 A1* | 6/2004 | Tsunekawa | H03H 9/643 333/195 |
| 2022/0337220 A1* | 10/2022 | Ballandras | H03H 9/02228 |

FOREIGN PATENT DOCUMENTS

| | | |
|---|---|---|
| EP | 1267490 A2 | 12/2002 |
| EP | 1394940 A1 | 3/2004 |
| EP | 1411634 A1 | 4/2004 |
| WO | 2021053399 A2 | 3/2021 |

OTHER PUBLICATIONS

Partial International Search Report—PCT/SG2023/050791—ISA/EPO—Mar. 19, 2024, 10 pages.
International Search Report and Written Opinion—PCT/SG2023/050791—ISA/EPO—Jun. 27, 2024, 19 pages.

\* cited by examiner

*Primary Examiner* — Samuel S Outten
(74) *Attorney, Agent, or Firm* — Polsinelli

(57) ABSTRACT

An apparatus for filtering is disclosed that implements a double-mode surface-acoustic-wave filter having a transition region with a partly uniform geometric property. In an example aspect, the double-mode surface-acoustic-wave filter includes at least one interdigital transducer with multiple fingers. The multiple fingers include a first set of fingers having a geometric property and a second set of fingers. The second set of fingers is positioned adjacent to the first set of fingers and is associated with an outer edge of the at least one interdigital transducer. The geometric property across a subset of the second set of fingers is substantially uniform. A value of the geometric property across the subset of the second set of fingers is different than a value of the geometric property across the first set of fingers.

29 Claims, 11 Drawing Sheets

1000

Provide a first set of fingers of at least one interdigital transducer of the double-mode surface-acoustic-wave filter, the first set of fingers having a geometric property
1002

Provide a second set of fingers of the at least one interdigital transducer of the double-mode surface-acoustic-wave filter, the second set of fingers positioned adjacent to the first set of fingers and associated with an outer edge of the at least one interdigital transducer, the geometric property across a subset of the second set of fingers being substantially uniform, a value of the geometric property across the subset of the second set of fingers being different than a value of the geometric property across the first set of fingers
1004

FIG. 10

DOUBLE-MODE SURFACE-ACOUSTIC-WAVE (DMS) FILTER HAVING A TRANSITION REGION WITH A PARTLY UNIFORM GEOMETRIC PROPERTY

TECHNICAL FIELD

This disclosure relates generally to wireless transceivers and other components that employ filters and, more specifically, to implementing a double-mode surface-acoustic-wave (DMS) filter that has a transition region with a partly constant geometric property.

BACKGROUND

Electronic devices use radio-frequency (RF) signals to communicate information. These radio-frequency signals enable users to talk with friends, download information, share pictures, remotely control household devices, and receive global positioning information. To transmit or receive the radio-frequency signals within a given frequency band, the electronic device may use filters to pass signals within the frequency band and to suppress (e.g., attenuate) jammers or noise having frequencies outside of the frequency band. It can be challenging, however, to design a filter that provides filtering for radio-frequency applications, including those that utilize frequencies above 100 megahertz (MHz).

SUMMARY

An apparatus is disclosed that implements a double-mode surface-acoustic-wave filter having a transition region with a partly uniform geometric property. The transition region of the double-mode surface-acoustic-wave filter includes sets of fingers respectively positioned at adjacent outer edges of two interdigital transducers. A geometric property across at least a portion of each set of fingers is substantially uniform. A value of the geometric property is different than a value of the geometric property across other sets of fingers outside of the transition region. Example geometric properties include a pitch and a metallization ratio. In some implementations, a profile of the pitch across the transition region has a trapezoidal shape with a well-type orientation. Additionally or alternatively, a profile of the metallization ratio within the transition region has a trapezoidal shape with a barrier-type orientation or a well-type orientation. These pitch and/or metallization ratio profiles enable suppression of spurious modes within the passband and enable the double-mode surface-acoustic-wave filter to have an aspect ratio that is within process limits. In this way, the double-mode surface-acoustic-wave filter can be integrated within space-constrained devices and can realize sufficient spurious mode suppression in the passband with fewer additional resonators (if any).

In an example aspect, an apparatus for filtering is disclosed. The apparatus includes a double-mode surface-acoustic-wave filter. The double-mode surface-acoustic-wave filter includes at least one interdigital transducer with multiple fingers. The multiple fingers include a first set of fingers having a geometric property and a second set of fingers. The second set of fingers is positioned adjacent to the first set of fingers and is associated with an outer edge of the at least one interdigital transducer. The geometric property across a subset of the second set of fingers is substantially uniform. A value of the geometric property across the subset of the second set of fingers is different than a value of the geometric property across the first set of fingers.

In an example aspect, a method for manufacturing a double-mode surface-acoustic-wave filter having a transition region with a partly uniform geometric property is disclosed. The method includes providing a first set of fingers of at least one interdigital transducer of the double-mode surface-acoustic-wave filter. The first set of fingers has a geometric property. The method also includes providing a second set of fingers of the at least one interdigital transducer of the double-mode surface-acoustic-wave filter. The second set of fingers are positioned adjacent to the first set of fingers and are associated with an outer edge of the at least one interdigital transducer. The geometric property across a subset of the second set of fingers is substantially uniform. A value of the geometric property across the subset of the second set of fingers is different than a value of the geometric property across the first set of fingers.

In an example aspect, an apparatus for filtering is disclosed. The apparatus includes a double-mode surface-acoustic-wave filter with at least two adjacent interdigital transducers. The at least two adjacent interdigital transducers include multiple fingers. A portion of the multiple fingers are positioned within a transition region of the double-mode surface-acoustic-wave filter. A profile of a pitch across the portion of the multiple fingers has a trapezoidal shape with a well-type orientation.

In an example aspect, an apparatus for filtering is disclosed. The apparatus includes a double-mode surface-acoustic-wave filter with at least two adjacent interdigital transducers. The at least two adjacent interdigital transducers include multiple fingers. A portion of the multiple fingers is positioned within a transition region of the double-mode surface-acoustic-wave filter. A profile of a geometric property across the portion of the multiple fingers has a trapezoidal shape.

In an example aspect, an apparatus for filtering is disclosed. The apparatus includes a double-mode surface-acoustic-wave filter with two adjacent interdigital transducers. Each interdigital transducer of the two adjacent interdigital transducers includes multiple fingers. The multiple fingers of each interdigital transducer of the two adjacent interdigital transducers includes a first set of fingers having a first pitch and a second set of fingers positioned adjacent to the first set of fingers. The second set of fingers is associated with an outer edge of the interdigital transducer. A subset of the second set of fingers has a second pitch that is substantially uniform. A value of the second pitch across the subset of the second set of fingers is less than a value of the first pitch across the first set of fingers. The second sets of fingers of the two adjacent interdigital transducers are adjacent to each other. Values of the second pitches associated with the two adjacent interdigital transducers are less than values of the first pitches associated with the two adjacent interdigital transducers.

BRIEF DESCRIPTION OF DRAWINGS

FIG. 4-1 illustrates an example implementation of a double-mode surface-acoustic-wave filter using a thin-film surface-acoustic-wave filter stack.

FIG. 4-2 illustrates another example implementation of a double-mode surface-acoustic-wave filter using a high-quality temperature-compensated surface-acoustic-wave filter stack.

FIG. 10 is a flow diagram illustrating an example process for manufacturing a double-mode surface-acoustic-wave filter having a transition region with a partly uniform geometric property.

DETAILED DESCRIPTION

Figure 1:
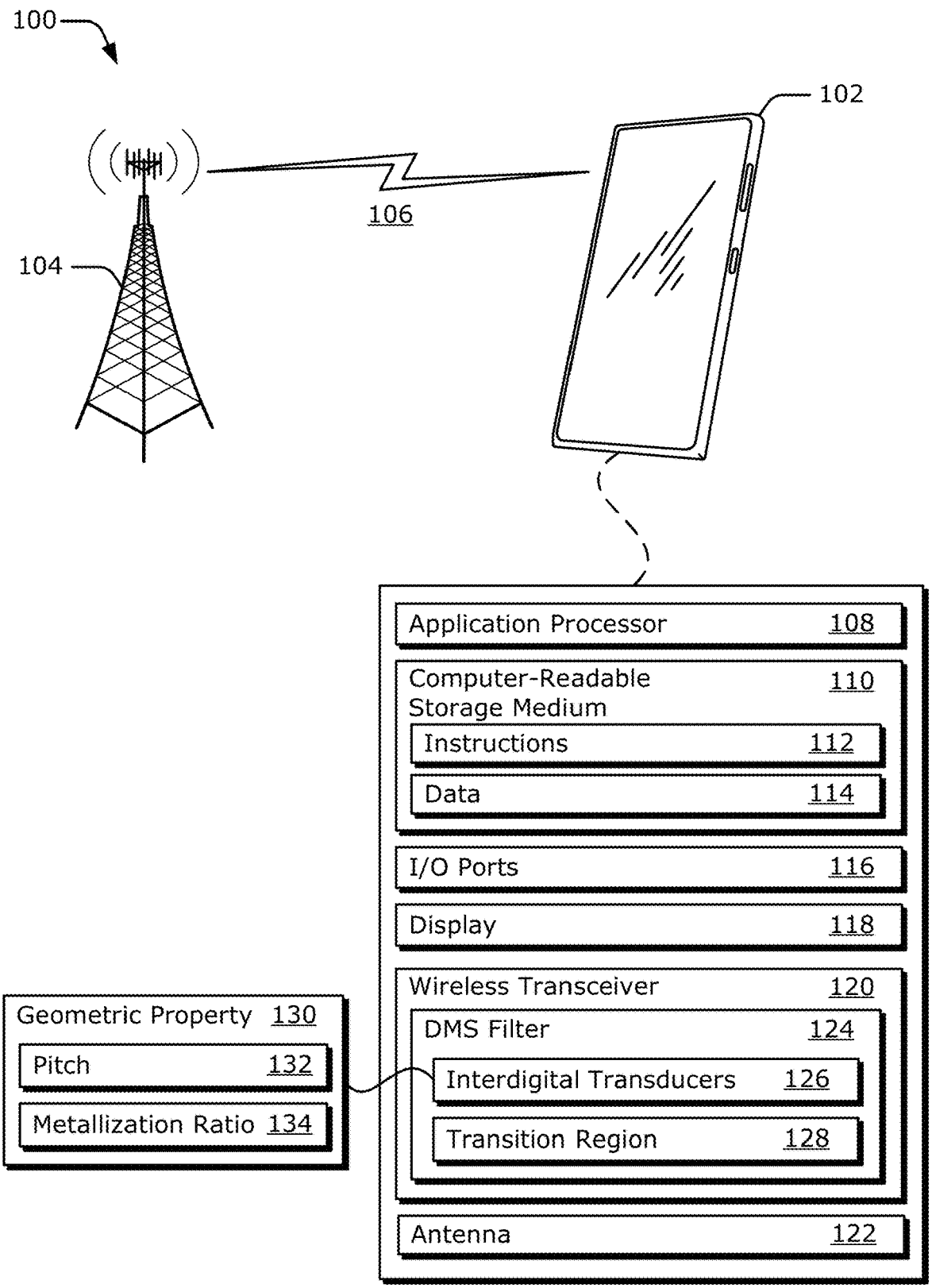
FIG. 1 illustrates an example operating environment for a double-mode surface-acoustic-wave filter having a transition region with a partly uniform geometric property.

To transmit or receive radio-frequency signals within a given frequency band, an electronic device may use filters to pass signals within the frequency band and to suppress (e.g., attenuate) jammers or noise having frequencies outside of the frequency band. Electroacoustic devices (e.g., "acoustic filters") can be used to filter high-frequency signals in many applications, such as those with frequencies that are greater than 100 megahertz (MHz). An acoustic filter is tuned to pass certain frequencies (e.g., frequencies within its passband) and attenuate other frequencies (e.g., frequencies that are outside of its passband). Using piezoelectric material as a vibrating medium, the acoustic filter operates by transforming an electrical signal wave that is propagating along an electrical conductor into an acoustic wave (e.g., an acoustic signal wave) that forms across the piezoelectric material. The acoustic wave is then converted back into an electrical filtered signal. The acoustic filter can include an electrode structure that transforms or converts between the electrical and acoustic waves.

The acoustic wave forms across the piezoelectric material and has a velocity with a magnitude that is significantly less than a velocity of an electromagnetic wave. Generally, the magnitude of the velocity of a wave is proportional to a wavelength of the wave. Consequently, after conversion of the electrical signal wave into the acoustic signal wave, the wavelength of the acoustic signal wave is significantly smaller than the wavelength of the electrical signal wave. The resulting smaller wavelength of the acoustic signal wave enables filtering to be performed using a smaller filter device. This permits acoustic filters to be used in space-constrained devices, including portable electronic devices such as cellular phones.

It can be challenging, however, to design a wideband acoustic filter with a compact design that can provide adequate suppression of a spurious mode (e.g., an undesired mode such as a Rayleigh mode) within a passband of the wideband acoustic filter. Some techniques use a double-mode surface-acoustic-wave (DMS) filter, which can have a smaller footprint compared to other types of acoustic filters. By itself, however, the double-mode surface-acoustic-wave filter might not be able to attenuate spurious modes within the passband by a desired amount. To address this issue, some filter architectures use multiple resonators, such as multiple surface-acoustic-wave filters arranged in a ladder-type structure. These additional filters can significantly increase an overall footprint of a wireless transceiver, which can make it challenging to integrate within space-constrained devices.

Other techniques may attempt to attenuate the spurious mode within the passband by customizing a geometric property of the electrode structure within a transition region of the double-mode surface-acoustic-wave filter. In some instances, it can be challenging to manufacture the electrode structure with a desired geometric property without causing an aspect ratio of the electrode structure to exceed process limits. If the aspect ratio exceeds the process limits, a sputtering process may have difficulty depositing portions of a compensation layer between fingers of the electrode structure. This can lead to gaps (e.g., holes or voids) within the portions of the compensation layer. These gaps can introduce additional ripples within the passband.

To address these challenges, example techniques for implementing a double-mode surface-acoustic-wave filter having a transition region with a partly uniform geometric property are described. The transition region of the double-mode surface-acoustic-wave filter includes sets of fingers respectively positioned at adjacent outer edges of two interdigital transducers. A geometric property across at least a portion of each set of fingers is substantially uniform. A value of the geometric property is different than a value of the geometric property across other sets of fingers outside of the transition region. Example geometric properties include a pitch and a metallization ratio. In some implementations, a profile of the pitch across the transition region has a trapezoidal shape with a well-type orientation. Additionally or alternatively, a profile of the metallization ratio within the transition region has a trapezoidal shape with a barrier-type orientation or a well-type orientation. These pitch and/or metallization ratio profiles enable suppression of spurious modes within the passband and enable the double-mode surface-acoustic-wave filter to have an aspect ratio that is within process limits. In this way, the double-mode surface-acoustic-wave filter can be integrated within space-constrained devices and can realize sufficient spurious mode suppression in the passband with fewer additional resonators (if any).

FIG. 1 illustrates an example environment 100 for operating a double-mode surface-acoustic-wave filter having a transition region with a partly uniform geometric property. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one double-mode surface-acoustic-wave filter 124 (DMS filter 124). The double-mode surface-acoustic-wave filter 124 can be implemented as, for example, a longitudinal-coupled double-mode surface-acoustic-wave (LDMS) filter. The double-mode surface-acoustic-wave filter 124 can be implemented using a thin-film surface-acoustic-wave (TFSAW) filter stack or a high-quality temperature-compensated surface-acoustic-wave (HQTC) filter stack. In general, the double-mode surface-acoustic-wave filter 124 excites at least two wave modes. In an example implementation, the double-mode surface-acoustic-wave filter 124 excites a main wave mode (e.g., a plate mode) and a cavity mode.

Figure 3:
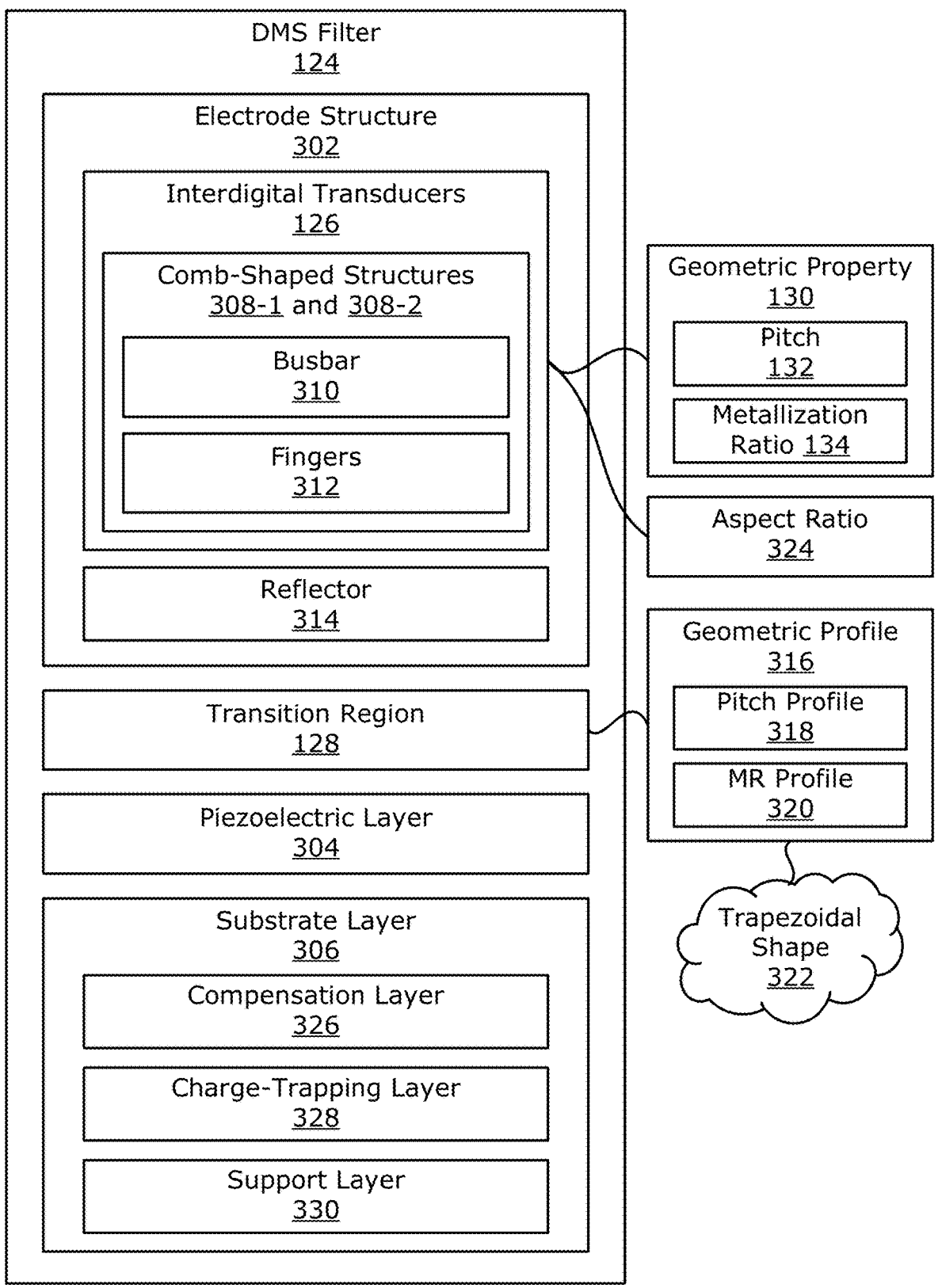
FIG. 3 illustrates example components of a double-mode surface-acoustic-wave filter.

The double-mode surface-acoustic-wave filter 124 includes at least two interdigital transducers 126 and at least one transition region 128, which are further described with respect to FIG. 3. At least one geometric property 130 of each of the interdigital transducers 126 is substantially uniform (e.g., substantially steady, constant, or static) across a portion of the transition region 128. In general, the term "substantially uniform" can mean that the geometric property changes by less than ±1% across a portion of the transition region 128 (e.g., across at least two pairs of adjacent fingers within the transition region 128). For example, the value of the geometric property across the portion of the transition region 128 can change by ±1%, ±0.75%, ±0.5% or less. This amount of variation can account for slight differences caused by process variations. Example geometric properties 130 include a pitch 132 and/or an metallization ratio 134. The pitch 132 can represent an average distance between adjacent fingers of an interdigital transducer 126. The metallization ratio 134 represents an average width of adjacent fingers divided by the pitch 132. The metallization ratio 134 can be represented by the Greek letter eta ($\eta$).

Across the transition region 128, a profile of the geometric property 130 can have a trapezoidal shape. For instance, a profile of the pitch 132 across the transition region 128 can have a trapezoidal shape with a well-type orientation. In this case, a "bottom" of the trapezoidal shape represents the portion of the transition region 128 in which the pitch 132 is substantially uniform. Additionally or alternatively, a profile of the metallization ratio 134 across the transition region 128 can have another trapezoidal shape. The trapezoidal shape of the profile of the metallization ratio can have a barrier-type orientation or a well-type orientation. For the barrier-type orientation, a "top" of the trapezoidal shape represents the portion of the transition region 128 in which the metallization ratio 134 is substantially uniform. The profiles of the pitch 132 and the metallization ratio 134 are further described with respect to FIGS. 8 and 9, respectively. The trapezoidal shape(s) of the pitch 132 and/or the metallization ratio 134 can differ from other types of double-mode surface-acoustic-wave filters that have a flat shape or a triangular shape. With the partly uniform geometric property 130, the double-mode surface-acoustic-wave filter 124 can suppress spurious modes within the passband. In this way, the double-mode surface-acoustic-wave filter 124 can have a smaller footprint and a lower cost compared to other double-mode surface-acoustic-wave filters with a constant pitch or a triangular shaped pitch within the transition region.

In some example implementations, a footprint of the double-mode surface-acoustic-wave filter 124 can be approximately 55% smaller than a footprint of another filter that doesn't employ the techniques of a partly uniform geometric property 130 within the transition region 128. Also, amplitudes of the ripples within the passband of the double-mode surface-acoustic-wave filter 124 can be less than approximately 0.1 decibels.

The double-mode surface-acoustic-wave filter 124 can be implemented as a wideband filter. For instance, a bandwidth of the double-mode surface-acoustic-wave filter 124 can be greater than or equal to approximately 4% of a center frequency of its passband. In some implementations, this bandwidth enables the double-mode surface-acoustic-wave filter 124 to filter frequencies associated with multiple frequency bands. The wireless transceiver 120 is further described with respect to FIG. 2.

Figure 2:
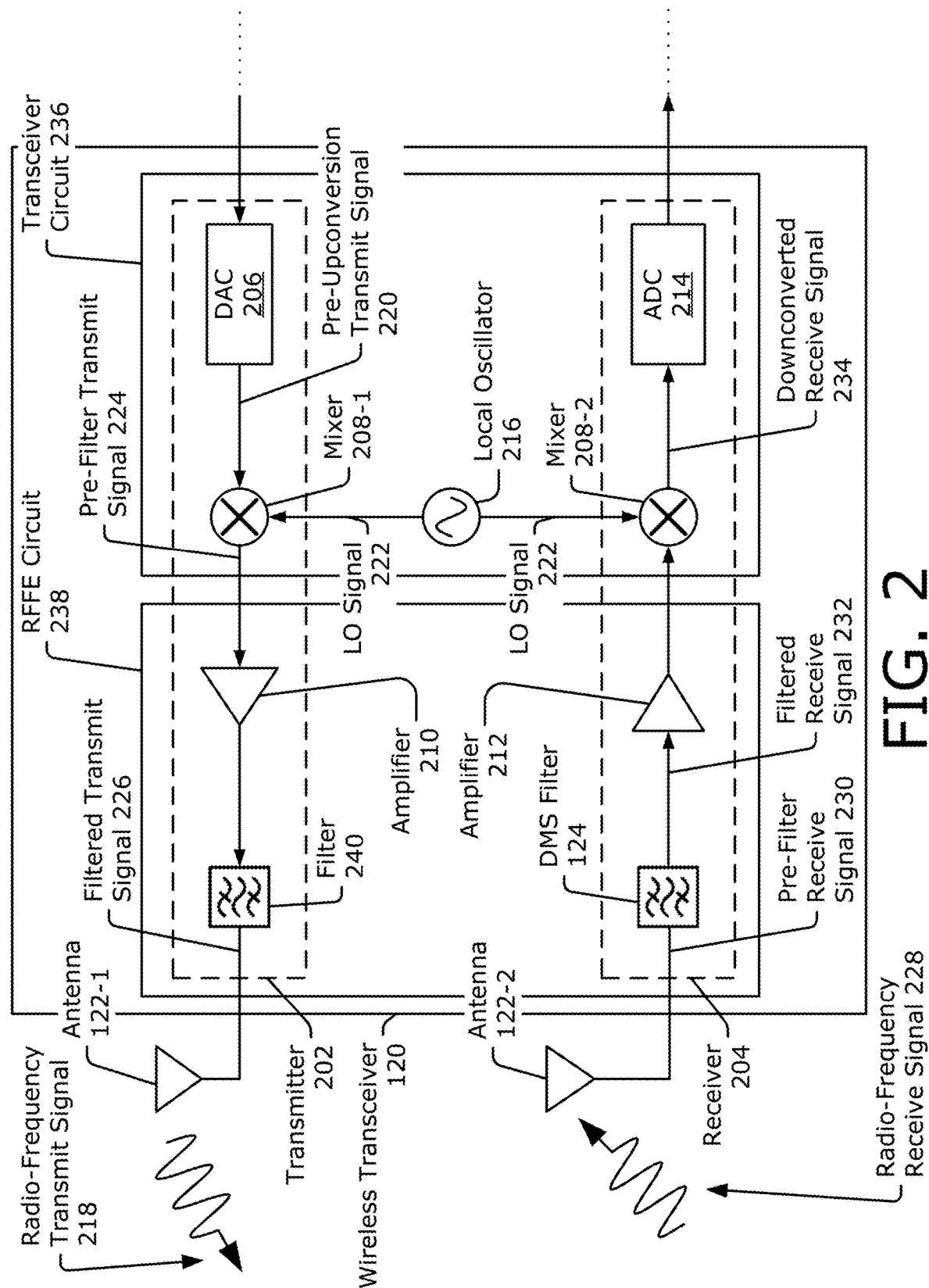
FIG. 2 illustrates an example wireless transceiver including a double-mode surface-acoustic-wave filter having a transition region with a partly uniform geometric property.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown). The transmitter 202 is shown to include at least one digital-to-analog converter 206 (DAC 206), at least one first mixer 208-1, at least one amplifier 210 (e.g., a power amplifier), and at least one filter 240. The filter 240 can be implemented as an acoustic filter. The receiver 204 includes at least one double-mode surface-acoustic-wave filter 124, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits (e.g., multiple integrated circuits), such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the filter 240 of the transmitter 202, the double-mode surface-acoustic-wave filter 124 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and include some noise or unwanted frequencies, such as a harmonic frequency. The amplifier 210 amplifies the pre-filter transmit signal 224 and passes the amplified pre-filter transmit signal 224 to the filter 240.

The filter 240 filters the amplified pre-filter transmit signal 224 to generate a filtered transmit signal 226. As part of the filtering process, the filter 240 attenuates the noise or unwanted frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The double-mode surface-acoustic-wave filter 124 accepts the received radio-frequency receive signal 228, which is represented by a pre-filter receive signal 230. The double-mode surface-acoustic-wave filter 124 filters any noise or unwanted frequencies within the pre-filter receive signal 230 to generate a filtered receive signal 232.

The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem).

FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which the double-mode surface-acoustic-wave filter 124 may be included. For example, the double-mode surface-acoustic-wave filter 124 can be integrated within a duplexer or diplexer of the wireless transceiver 120. Also, some implementations of the wireless transceiver 120 can implement the filter 240 using another double-mode surface-acoustic-wave filter 124. An example implementation of the double-mode surface-acoustic-wave filter 124 is further described with respect to FIG. 3.

FIG. 3 illustrates example components of the double-mode surface-acoustic-wave filter 124. In the depicted configuration, the double-mode surface-acoustic-wave filter 124 includes an electrode structure 302, a piezoelectric layer 304, and at least one substrate layer 306. The electrode structure 302 comprises an electrically conductive material, such as metal, and can include one or more layers. The one or more layers can include one or more metal layers and can optionally include one or more adhesion layers. As an example, the metal layers can be composed of aluminium (Al), copper (Cu), silver (Ag), gold (Au), tungsten (W), platinum (Pt), or some combination or doped version thereof. The adhesion layers can be composed of chromium (Cr), titanium (Ti), molybdenum (Mo), or some combination thereof.

The electrode structure 302 can include two or more interdigital transducers 126. The interdigital transducers 126 convert an electrical signal into an acoustic wave and converts the acoustic wave into a filtered electrical signal. Each interdigital transducer 126 includes at least two comb-shaped structures 308-1 and 308-2. Each comb-shaped structure 308-1 and 308-2 includes a busbar 310 (e.g., a conductive segment or rail) and multiple fingers 312 (e.g., electrode fingers). The electrode structure 302 can also optionally include two or more reflectors 314. In an example implementation, the interdigital transducers 126 are arranged between two reflectors 314, which reflect the acoustic wave back towards the interdigital transducers 126. Examples of the electrode structure 302 and the interdigital transducers 126 are further described with respect to FIGS. 4-1 to 6.

One or more physical characteristics of the interdigital transducers 126 can be characterized by the geometric property 130. In particular, the geometric property 130 describes the positioning and/or physical characteristic(s) of the fingers 312 within the electrode structure 302. Example geometric properties 130 include the pitch 132 and the metallization ratio 134, which can vary across the electrode structure 302.

The transition region 128 represents sets of fingers 312 respectively positioned at adjacent outer edges of two adjacent interdigital transducers 126. The transition region 128 is further described with respect to FIGS. 5 and 6. A profile of the geometric property 130 (e.g., a geometric profile 316) across a portion of the transition region 128 can be substantially uniform. Example geometric profiles 316 include a profile of the pitch 132 (e.g., a pitch profile 318) and/or a profile of the metallization ratio 134 (e.g., a metallization ratio (MR) profile 320). A profile of the geometric property 130 can have a trapezoidal shape 322, as further described with respect to FIGS. 8 and 9.

This trapezoidal shape 322 enables the double-mode surface-acoustic-wave filter 124 to achieve a target amount of spurious mode suppression within the passband while having an aspect ratio 324 within process limits. The aspect ratio 324 represents an average thickness (or height) of adjacent fingers 312 divided by a distance of the physical gap between the adjacent fingers. An example process limit can specify the aspect ratio 324 to be less than or equal to approximately 50%. In this case, the interdigital transducers 126 can have an aspect ratio 324 that is approximately 50%, 45%, 40%, and so forth. Other limitations of the aspect ratio 324 are also possible. With an appropriate aspect ratio 324, the double-mode surface-acoustic-wave filter 124 can be readily manufactured without introducing significant ripples in the passband. For instance, the aspect ratio 324 can be sufficient to enable a sputtering process to deposit a compensation layer, such as a silicon dioxide layer, between adjacent fingers 312 of the interdigital transducer 126 without introducing gaps (e.g., holes or voids) within the compensation layer.

In general, the limits placed on the aspect ratio 324 can vary for different types of manufacturing processes and can vary for different types of filter stacks. Designing the double-mode surface-acoustic-wave filter 124 to have an aspect ratio 324 that satisfies the process limit can be particularly applicable for implementations that include a compensation layer disposed on the electrode structure 302. Generally speaking, the techniques for designing a double-mode surface-acoustic-wave filter 124 having a transition region 128 with a partly uniform geometric property 130 can apply to filter stacks that do not include the compensation layer (e.g., the thin-film surface-acoustic-wave filter stack of FIG. 4-1) and filter stacks that include the compensation layer (e.g., the high-quality temperature-compensated filter stack of FIG. 4-2).

In example implementations, the piezoelectric layer 304 can be implemented using a variety of different materials that exhibit piezoelectric properties (e.g., can transfer mechanical energy into electrical energy or electrical energy into mechanical energy). Example types of material include lithium niobate ($LiNbO_3$), lithium tantalate ($LiTaO_3$), quartz, aluminium nitride (AlN), aluminium scandium nitride (AlScN), or some combination thereof. In general, the material that forms the piezoelectric layer 304 has a crystalline structure. This crystalline structure is defined by an ordered arrangement of particles (e.g., atoms, ions, or molecules). In some implementations, the piezoelectric layer 304 has an electromechanical coupling factor ($k^2$) that is greater than or equal to approximately 4%.

The substrate layer 306 includes one or more sublayers that can support passivation, temperature compensation, power handling, mode suppression, and so forth. As an example, the substrate layer 306 can include at least one compensation layer 326, at least one charge-trapping layer 328, at least one support layer 330, or some combination thereof. These sublayers can be considered part of the substrate layer 306 or their own separate layers.

The compensation layer 326 can provide temperature compensation to enable the double-mode surface-acoustic-wave filter 124 to achieve a target temperature coefficient of frequency based on the thickness of the piezoelectric layer 304. In some implementations, a thickness of the compensation layer 326 can be tailored to provide mode suppression (e.g., suppress a spurious plate mode). In example implementations, the compensation layer 326 can be implemented using at least one silicon dioxide ($SiO_2$) layer, at least one doped silicon dioxide layer, at least one silicon nitride layer, at least one silicon oxynitride layer, or some combination thereof. In some applications, the substrate layer 306 may not include, for instance, the compensation layer 326 to reduce cost of the double-mode surface-acoustic-wave filter 124.

The charge-trapping layer 328 can trap induced charges at the interface between the compensation layer 326 and the support layer 330 in order to, for example, suppress non-linear substrate effects. The charge-trapping layer 328 can include at least one polysilicon (poly-Si) layer (e.g., a polycrystalline silicon layer or a multicrystalline silicon layer), at least one amorphous silicon layer, at least one silicon nitride (SiN) layer, at least one silicon oxynitride (SiON) layer, at least one aluminium nitride (AlN) layer, diamond-like carbon (DLC), diamond, or some combination thereof.

The support layer 330 can enable the acoustic wave to form across the surface of the piezoelectric layer 304 and reduce the amount of energy that leaks into the substrate layer 306. In some implementations, the support layer 330 can also act as a compensation layer 326. In general, the support layer 330 is composed of material that is non-conducting and provides isolation. For example, the support layer 330 can be formed using silicon (Si) material (e.g., a doped high-resistive silicon material), sapphire material (e.g., aluminium oxide ($Al_2O_3$)), silicon carbide (SiC) material, fused silica material, quartz, glass, diamond, or some combination thereof. In some implementations, the support layer 330 has a relatively similar thermal expansion coefficient (TEC) as the piezoelectric layer 304. The support layer 330 can also have a particular crystal orientation to support the suppression or attenuation of spurious modes.

In some aspects, the double-mode surface-acoustic-wave filter 124 can be considered a resonator or formed from multiple resonators. Sometimes the double-mode surface-acoustic-wave filter 124 can be connected to other resonators associated with the same or different layer stacks than the double-mode surface-acoustic-wave filter 124. The electrode structure 302, the piezoelectric layer 304, and the substrate layer 306 are further described with respect to FIGS. 4-1 and 4-2.

Figures 1, 4:
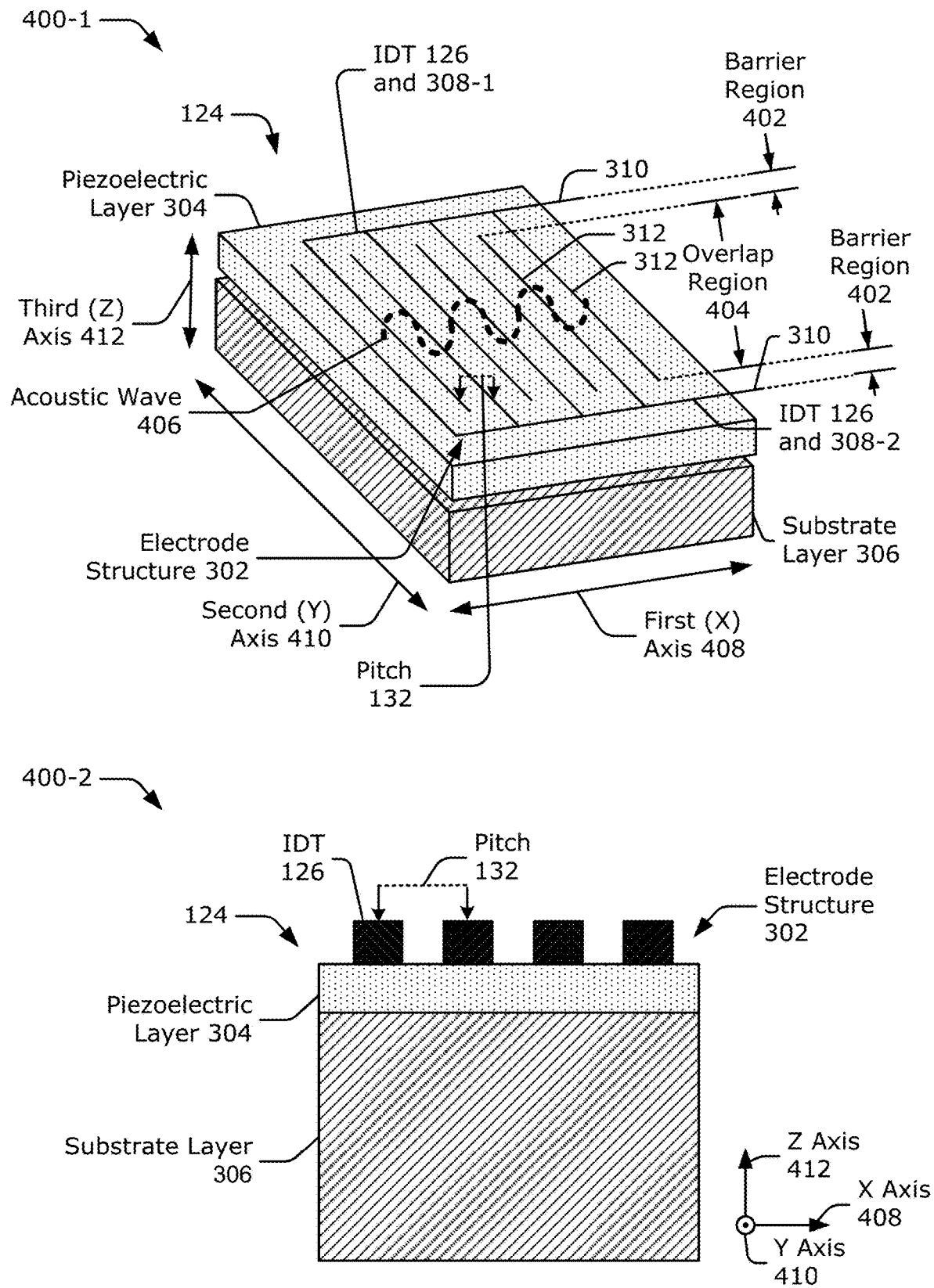
Figure 4:
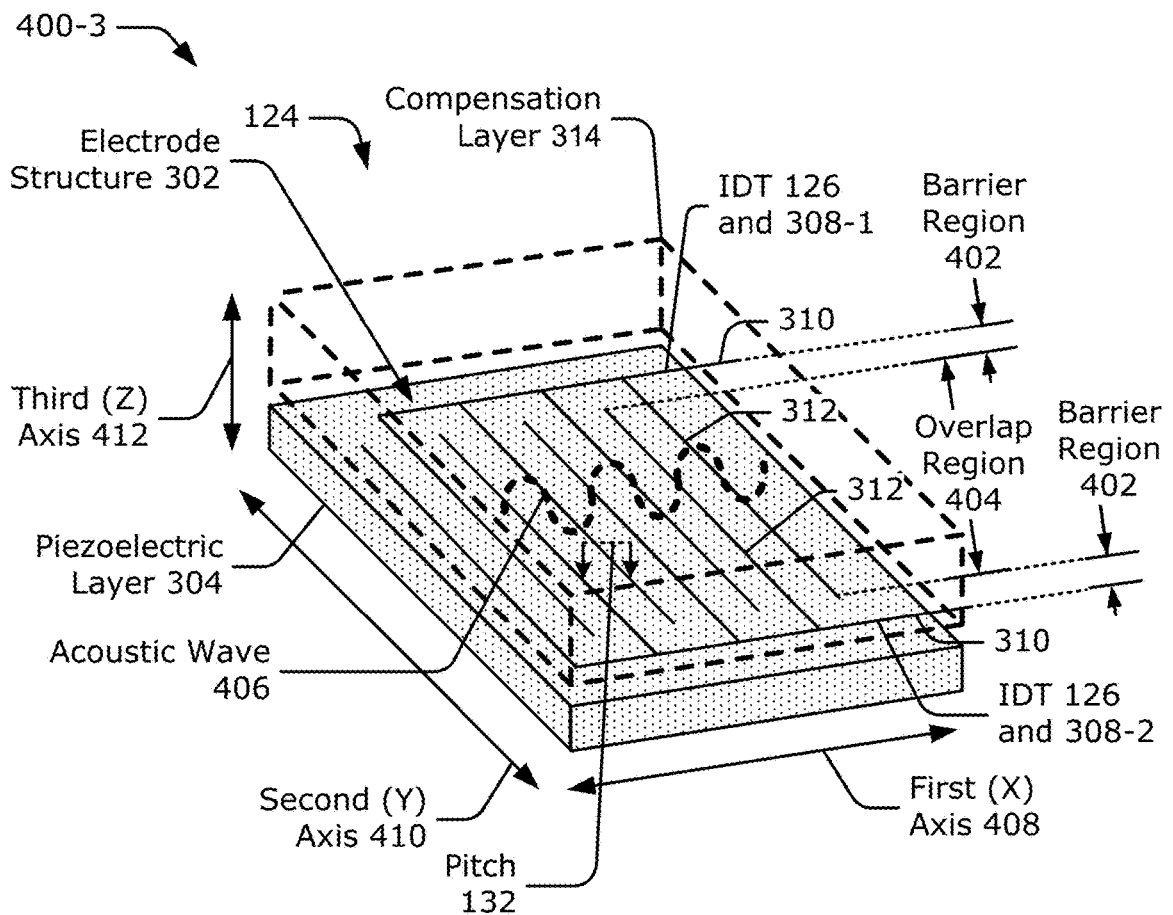
Figure 2:
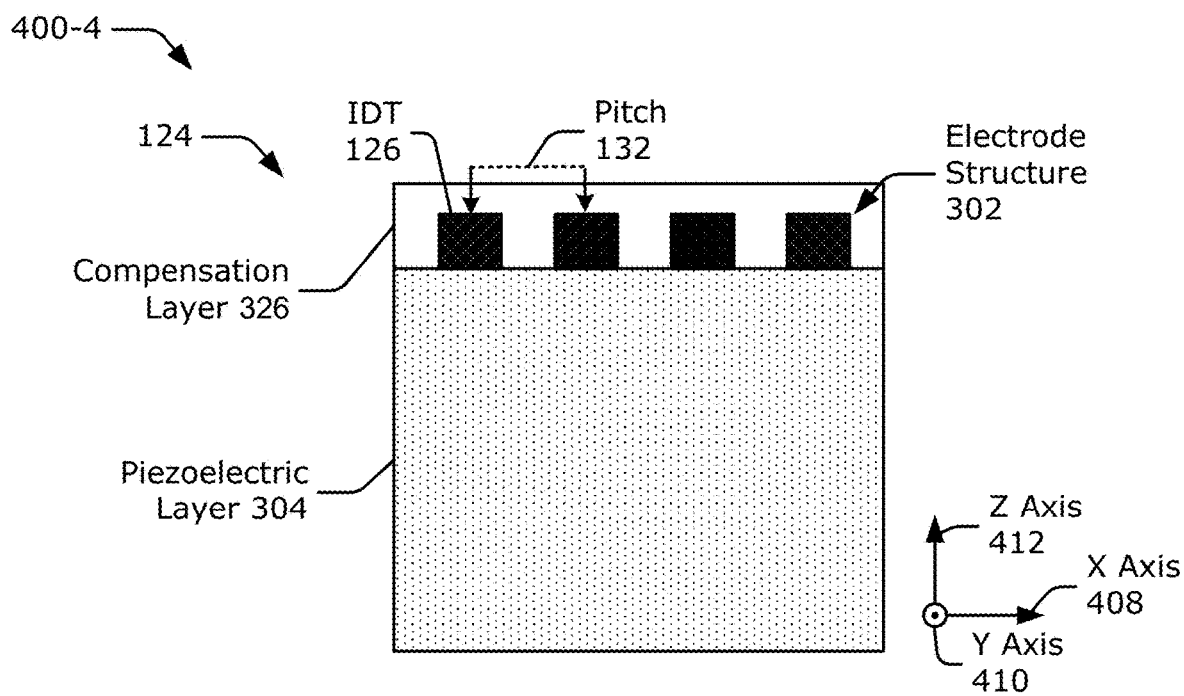

FIG. 4-1 illustrates an example implementation of the double-mode surface-acoustic-wave filter 124 using a thin-film surface-acoustic-wave filter stack. A three-dimensional perspective view 400-1 of the double-mode surface-acoustic-wave filter 124 is shown at the top of FIG. 4-1, and a two-dimensional cross-section view 400-2 of the double-mode surface-acoustic-wave filter 124 is shown at the bottom of FIG. 4-1.

The double-mode surface-acoustic-wave filter 124 includes at least one electrode structure 302, at least one piezoelectric layer 304, and at least one substrate layer 306. In the depicted configuration shown in the two-dimensional cross-section view 400-2, the piezoelectric layer 304 is disposed between the electrode structure 302 and the substrate layer 306. A portion of the electrode structure 302 depicted in FIG. 4-1 includes at least a portion of one interdigital transducer 126. The electrode structure 302 can include additional interdigital transducers 126 not explicitly shown in FIG. 4-1. Also, the interdigital transducer 126 depicted in FIG. 4-1 can include additional fingers 312 not explicitly shown in FIG. 4-1.

In the three-dimensional perspective view 400-1, the interdigital transducer 126 is shown to have the two comb-shaped structures 308-1 and 308-2 with fingers 312 extending from two busbars 310 towards each other. The fingers 312 are arranged in an interlocking manner in between the two busbars 310 of the interdigital transducer 126 (e.g., arranged in an interdigitated manner). In other words, the fingers 312 connected to a first busbar 310 extend towards a second busbar 310 but do not connect to the second busbar 310. As such, there is a barrier region 402 (e.g., a transversal gap region) between the ends of these fingers 312 and the second busbar 310. Likewise, fingers 312 connected to the second busbar 310 extend towards the first busbar 310 but do not connect to the first busbar 310. There is therefore a barrier region 402 between the ends of these fingers 312 and the first busbar 310.

In the direction along the busbars 310, there is an overlap region 404 where a portion of one finger 312 overlaps with a portion of an adjacent finger 312. This overlap region 404 may be referred to as the aperture, track, or active region where electric fields are produced between fingers 312 to cause an acoustic wave 406 to form at least in this region of the piezoelectric layer 304.

A physical periodicity of the fingers 312 is referred to as the pitch 132 of the interdigital transducer 126. The pitch 132 may be indicated in various ways. For example, in certain aspects, the pitch 132 may correspond to a magnitude of a distance between adjacent fingers 312 of the interdigital transducer 126 in the overlap region 404. This distance may be defined, for example, as the distance between center points of each of the fingers 312. The distance may be generally measured between a right (or left) edge of one finger 312 and the right (or left) edge of an adjacent finger 312 when the fingers 312 have uniform widths. In certain aspects, an average of distances between adjacent fingers 312 of the interdigital transducer 126 may be used for the pitch 132. The frequency at which the piezoelectric layer 304 vibrates is a main-resonance frequency of the electrode structure 302. The frequency is determined at least in part by the pitch 132 of the interdigital transducer 126 and other properties of the double-mode surface-acoustic-wave filter 124.

In the three-dimensional perspective view 400-1, the double-mode surface-acoustic-wave filter 124 is defined by a first (X) axis 408, a second (Y) axis 410, and a third (Z) axis 412. The first axis 408 and the second axis 410 are parallel to a planar surface of the piezoelectric layer 304, and the second axis 410 is perpendicular to the first axis 408. The third axis 412 is normal (e.g., perpendicular or orthogonal) to the planar surface of the piezoelectric layer 304. The busbars 310 of the interdigital transducer 126 are oriented to be parallel to the first axis 408. The fingers 312 of the interdigital transducer 126 are orientated to be parallel to the second axis 410. Also, an orientation of the piezoelectric layer 304 causes the acoustic wave 406 to mainly form in a direction of the first axis 408. As such, the acoustic wave 406 forms in a direction that is substantially perpendicular or orthogonal to the direction of the fingers 312 of the interdigital transducer 126.

FIG. 4-2 illustrates an example implementation of the double-mode surface-acoustic-wave filter 124 using a high-quality temperature-compensated surface-acoustic-wave filter stack. A three-dimensional perspective view 400-3 of the double-mode surface-acoustic-wave filter 124 is shown at the top of FIG. 4-2, and a two-dimensional cross-section view 400-4 of the double-mode surface-acoustic-wave filter 124 is shown at the bottom of FIG. 4-2.

The double-mode surface-acoustic-wave filter 124 includes at least one electrode structure 302, at least one piezoelectric layer 304, and at least one compensation layer 326. The compensation layer 326 can provide temperature compensation to enable the double-mode surface-acoustic-wave filter 124 to achieve a target temperature coefficient of frequency. In example implementations, the compensation layer 326 can be implemented using at least one silicon dioxide layer.

In the depicted configuration shown in the two-dimensional cross-section view 400-4, the electrode structure 302 is disposed between the piezoelectric layer 304 and the compensation layer 326. The piezoelectric layer 304 can form a substrate of the double-mode surface-acoustic-wave filter 124.

The electrode structure 302 of the high-quality temperature-compensated filter stack can be similar to the electrode structure 302 described above with respect to the thin-film surface-acoustic-wave filter stack of FIG. 4-1. Likewise, the piezoelectric layer 304 of the high-quality temperature-compensated filter stack can be similar to the piezoelectric layer 304 described above with respect to the thin-film surface-acoustic-wave filter stack of FIG. 4-1. The piezoelectric layer 304 of the high-quality temperature-compensated surface-acoustic-wave filter stack, however, can be thicker than the piezoelectric layer 304 of the thin-film surface-acoustic-wave filter stack of FIG. 4-1. Similar to the thin-film surface-acoustic-wave filter stack of FIG. 4-1, the high-quality temperature-compensated surface-acoustic-wave filter stack of FIG. 4-2 can also include the barrier region 402 and the central region 404.

One of ordinary skill in the art can appreciate the variety of filter stacks in which the double-mode surface-acousticwave filter 124 can be implemented. It should be appreciated that while a certain number of fingers 312 are illustrated in FIGS. 4-1 and 4-2, the number of actual fingers and lengths and width of the fingers 312 and busbars 310 may be different in an actual implementation. Such parameters depend on the particular application and desired filter characteristics. In addition, the double-mode surface-acoustic-wave filter 124 can include multiple interdigital transducers 126 to achieve a desired filter transfer function. An example electrode structure 302 with multiple interdigital transducers 126 is further described with respect to FIG. 5.

Figure 5:
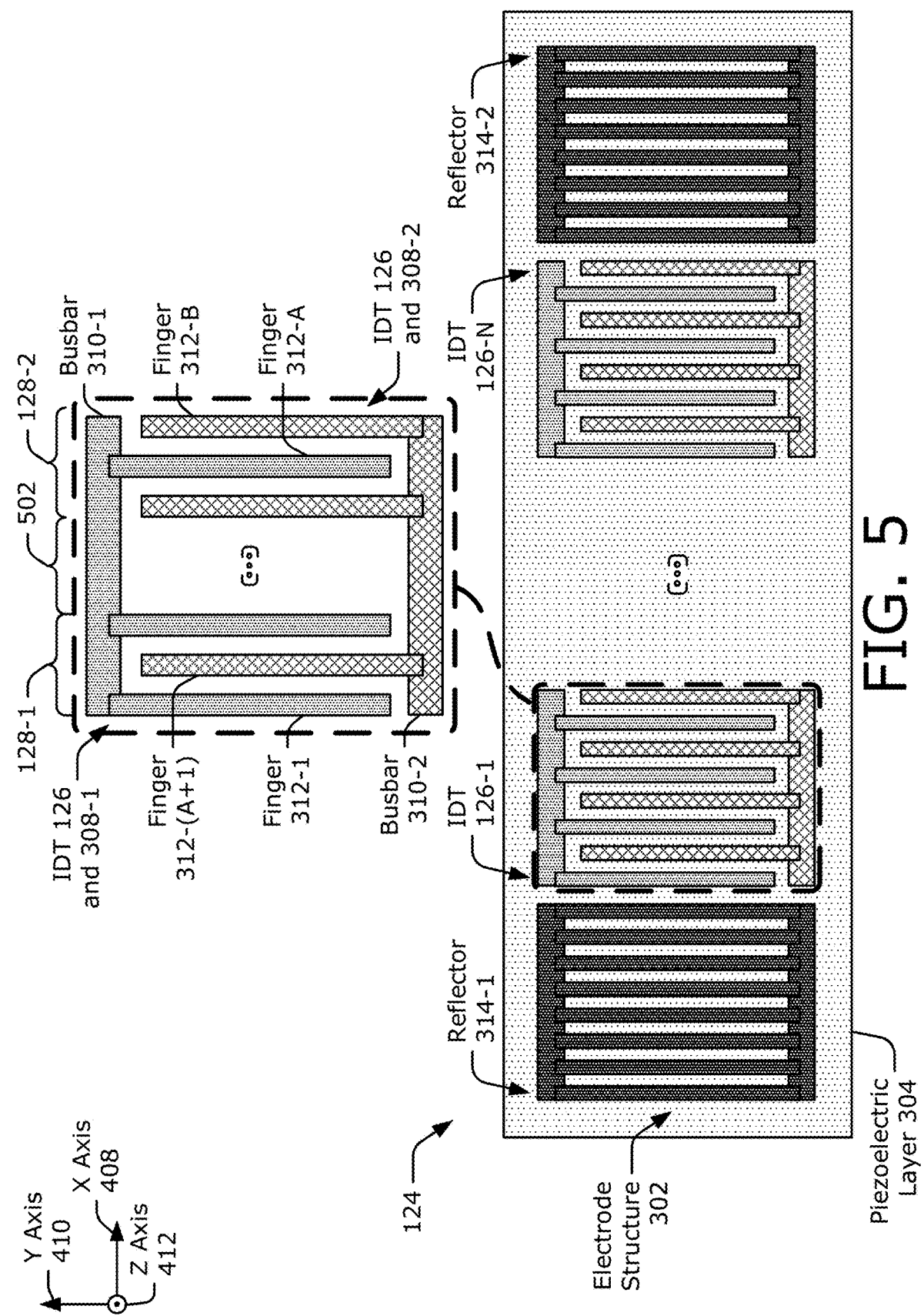
FIG. 5 illustrates an example electrode structure of a double-mode surface-acoustic-wave filter.

FIG. 5 illustrates an example electrode structure 302 of a double-mode surface-acoustic-wave filter 124. In the depicted configuration, the electrode structure 302 includes interdigital transducers 126-1 to 126-N, where N represents a positive integer. In example implementations, the variable N can be equal to 3, 4, 5, 7, and so forth.

The electrode structure 302 also includes reflectors 314-1 and 314-2. The interdigital transducers 126-1 to 126-N are arranged between the reflectors 314-1 and 314-2. In this way, the reflectors 314-1 and 314-2 reflect the acoustic wave 406 back towards the interdigital transducers 126-1 to 126-N. Each reflector 314-1 and 314-2 within the electrode structure 302 can have two busbars 310 and a grating structure of conductive fingers 312 that connect to both busbars 310. In some implementations, a pitch of the reflector 314 can be similar to the pitch 132 of the interdigital transducer 126 to reflect the acoustic wave 406 in the resonant frequency range.

Each interdigital transducer 126 includes a first busbar 310-1, a second busbar 310-2, and fingers 312-1 to 312-B, where B represents a positive integer. The first busbar 310-1 and the fingers 312-1 to 312-A form at least a portion of the first comb-shaped structure 308-1, where A represents a positive integer that is less than B. The fingers 312-1 to 312-A are connected to the first busbar 310-1 and extend along the second (Y) axis 410 towards the second busbar 310-2 without connecting to the second busbar 310-2. The second busbar 310-2 and the fingers 312-(A+1) to 312-B form at least a portion of the second comb-shaped structure 308-2. The fingers 312-(A+1) to 312-B are connected to the second busbar 310-2 and extend along the second (Y) axis 410 towards the first busbar 310-1 without connecting to the first busbar 310-1.

The fingers 312 within the interdigital transducer 126 can be associated with a first transition region 128-1, a central region 502, or a second transition region 128-2. The central region 502 is positioned between the first and second transition regions 128-1 and 128-2 along the first axis 408. The first and second transition regions 128-1 and 128-2 are associated with opposite outer edges of the interdigital transducer 126. For instance, the first transition region 128-1 is associated with a "left" edge of the interdigital transducer 126, and the second transition region 128-2 is associated with a "right" edge of the interdigital transducer 126. Although not explicitly shown, the first and second transition regions 128-1 and 128-2 can also include fingers 312 of an adjacent interdigital transducer 126. The central region 502 is associated with a center of the interdigital transducer 126 and does not include additional fingers 312 associated with the adjacent interdigital transducer 126.

In general, the transition region 128 includes portions of two adjacent interdigital transducers 126 that form a smooth, continuous transition with quasi-periodic grating between adjacent elements. The pitch 132 and the metallization ratio 134 of the interdigital transducers 126 can vary across the first axis 408, as further described with respect to FIG. 6.

Figure 6:
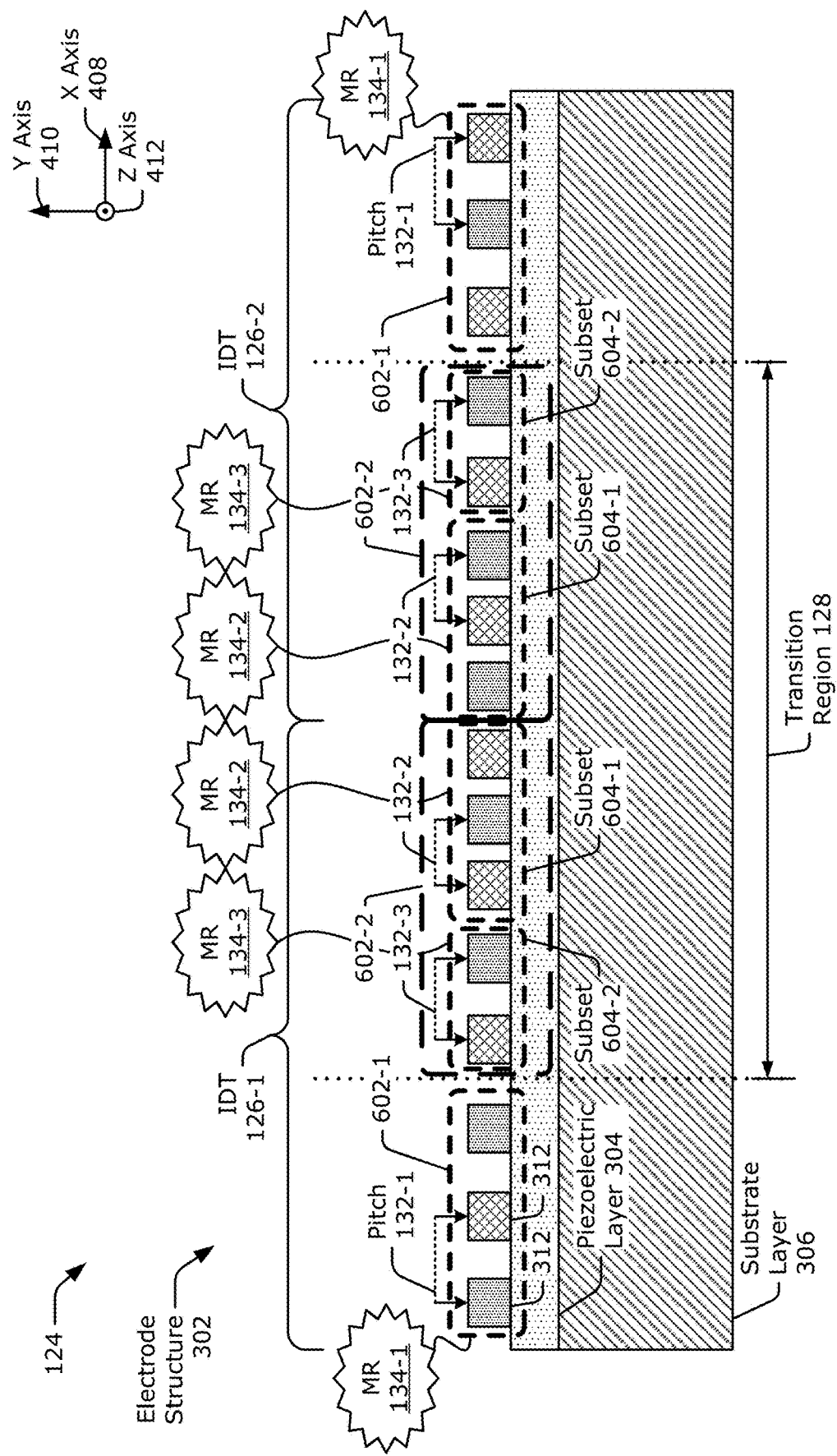
FIG. 6 illustrates example geometric properties of a double-mode surface-acoustic-wave filter.

FIG. 6 illustrates example geometric properties 130 of the double-mode surface-acoustic-wave filter 124. A portion of the double-mode surface-acoustic-wave filter 124 includes two adjacent interdigital transducers 126-1 and 126-2 of the electrode structure 302, which are disposed on the piezoelectric layer 304. Each interdigital transducer 126 includes multiple fingers 312. In particular, each of the interdigital transducers 126-1 and 126-2 includes a first set of fingers 602-1 positioned within the central region 502 (e.g., outside of the transition region 128). Additionally, each of the interdigital transducers 126-1 and 126-2 includes a second set of fingers 602-2 that are positioned adjacent to the first set of fingers 602-1 and are within the transition region 128. In general, the second set of fingers 604-2 are proximate to an outer edge of the interdigital transducer 126 (e.g., proximate to the adjacent interdigital transducer 126). The term "proximate" can refer to the second set of fingers 602-2 being closer to the outer edge of the interdigital transducer 126 compared to a center of the interdigital transducer 126.

In general, the first set of fingers 602-1 represents fingers 312 that are not associated with the transition region 128. At least some of the fingers 312 within the first set of fingers 602-1 can be proximate to a center of the interdigital transducer 126 (e.g., closer to a center of the interdigital transducer 126 compared to an outer edge). Although not explicitly shown, each interdigital transducer 126 can include a third set of fingers that are positioned adjacent to the first set of fingers 602-1 and are within another transition region 128 that is associated with another outer edge of the interdigital transducer 126.

In some implementations, the first set of fingers 602-1 includes a larger quantity of fingers than the second set of fingers 602-2. In example implementations, the second set of fingers 604-2 includes at least four fingers 312 (e.g., four fingers, five fingers, or more). As such, the transition region 128 associated with the two adjacent interdigital transducers 126 can include eight or more fingers 312 (e.g., ten fingers).

Individual pitches 132 between adjacent fingers 312 can vary across each interdigital transducer 126. In one aspect, the pitch 132 can be substantially uniform across the first set of fingers 602-1, as represented by a pitch 132-1. Additionally, the pitch 132 can be substantially uniform across a first subset 604-1 of the second set of fingers 604-2, as represented by a pitch 132-2. A value of the pitch 132-2 can be different than the value of the pitch 132-1. In particular, the value of the pitch 132-2 can be less than a value of the pitch 132-1.

The pitch 132 can vary across a second subset 604-2 of the second set of fingers 604-2, as represented by a pitch 132-3. For instance, a value of the pitch 132-3 can incrementally increase or decrease between the value of the pitch 132-1 and the value of the pitch 132-2. Based on the values of the pitches 132-2 and 132-3, the pitch profile 318 across the transition region 128 can have a trapezoidal shape 322, as further described with respect to FIG. 8. The first subset 604-1 and the second subset 604-2 can be considered proper subsets of the second set of fingers 602-2.

Optionally, individual metallization ratios 134 between adjacent fingers 312 can vary across each interdigital transducer 126. In one aspect, the metallization ratio 134 can be substantially uniform across the first set of fingers 602-1, as represented by a metallization ratio 134-1 (MR 134-1). Additionally, the metallization ratio 134 can be substantially uniform across the first subset 604-1 of the second set of fingers 604-2, as represented by a metallization ratio 134-2 (MR 134-2). In some implementations, a value of the metallization ratio 134-2 is different than a value of the metallization ratio 134-1. In particular, the value of the metallization ratio 134-2 can be less than or greater than the value of the metallization ratio 134-1. In other implementations, a value of the metallization ratio 134-2 can be substantially similar to a value of the metallization ratio 134-1 (e.g., within ±1%).

The metallization ratio 134 can also vary across the second subset 604-2 of the second set of fingers 604-2, as represented by a metallization ratio 134-3 (MR 134-3). For instance, a value of the metallization ratio 134-3 can incrementally increase or decrease between the value of the metallization ratio 134-1 and the value of the metallization ratio 134-2. Based on the values of the metallization ratios 134-2 and 134-3, the metallization ratio profile 320 across the transition region 128 can have a trapezoidal shape 322, as further described with respect to FIG. 9.

The quantity of fingers 312 within the second set of fingers 604-2 can be tailored to realize a target frequency offset between the cavity mode and the main wave mode of the double-mode surface-acoustic-wave filter 124. In general, the first subset 604-1 includes at least two pairs of adjacent fingers 312 (e.g., at least three fingers 312). The quantity of fingers 312 within the second subset 604-2 of the second set of fingers 604-2 includes one or more fingers 312. The electrode structure 302 can have multiple transition regions 128, as further described with respect to FIG. 7.

Figure 7:
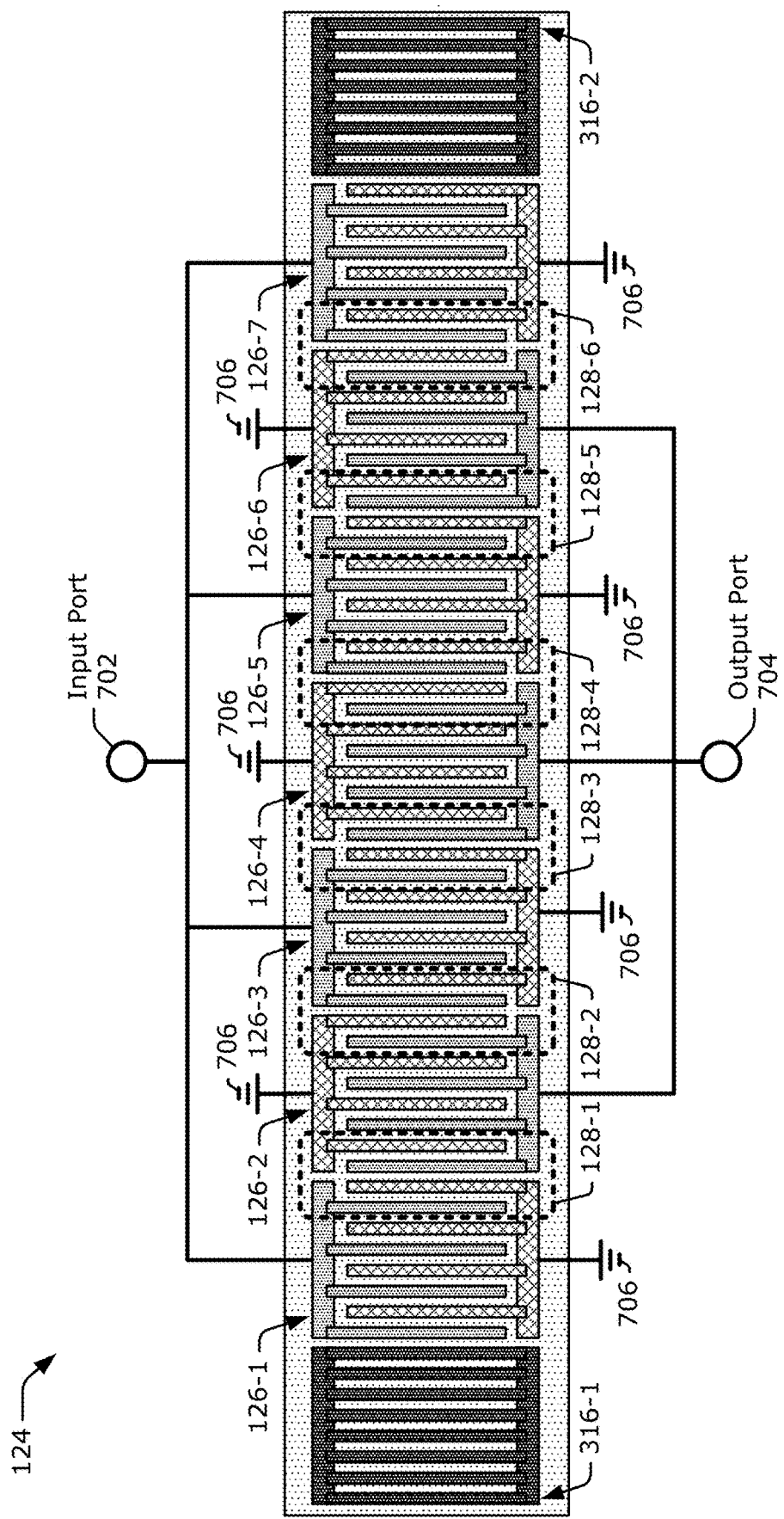
FIG. 7 illustrates an example double-mode surface-acoustic-wave filter having a transition region with a partly uniform geometric property.

FIG. 7 illustrates an example double-mode surface-acoustic-wave filter 124 having at least one transition region 128 with a partly uniform geometric property 130. The double-mode surface-acoustic-wave filter 124 includes an input port 702 and an output port 704. In this example, the double-mode surface-acoustic-wave filter 124 includes seven interdigital transducers 126 (e.g., interdigital transducers 126-1, 126-2, 126-3, 126-4, 126-5, 126-6, and 126-7). Other implementations are also possible in which the double-mode surface-acoustic-wave filter 124 includes two, three, four, five, or more interdigital transducers 126.

In general, at least two of the interdigital transducers 126 have first busbars 310-1 coupled to the input port 702 and second busbars 310-2 coupled to a ground 706. At least one of the interdigital transducers 126 has a first busbar 310-1 coupled to the output port 704 and a second busbar 310-2 coupled to the ground 706. The at least one interdigital transducer 126 that is coupled to the output port 704 is interspersed between the at least two interdigital transducers 126 coupled to the input port 702.

In this example, four interdigital transducers 126 (e.g., interdigital transducers 126-1, 126-3, 126-5, and 126-7) have first busbars 310-1 coupled to the input port 702 and second busbars 310-2 coupled to the ground 706. Also, three interdigital transducers 126 (e.g., interdigital transducers 126-2, 126-4, and 126-6) are interspersed between the four interdigital transducers 126 and have first busbars 310-1 coupled to the output port 704 and second busbars 310-2 coupled to the ground 706.

The double-mode surface-acoustic-wave filter 124 includes multiple transition regions 128 (e.g., transition regions 128-1, 128-2, 128-3, 128-4, 128-5, and 128-6). The pitch 132-2 within the first subset 604-1 of the second set of fingers 602-2 can be similar or different between two or more of the transition regions 128-1 to 128-6. Likewise, the metallization ratio 134-4 within the first subset 604-1 of the second set of fingers 602-2 can be similar or different between two or more of the transition regions 128-1 to 128-6. The pitch profile 318 and/or the metallization ratio profile 320 can have a trapezoidal shape 322 within one or more of the transition regions 128-1 to 128-6, as further described with respect to FIGS. 8 and 9.

Figure 8:
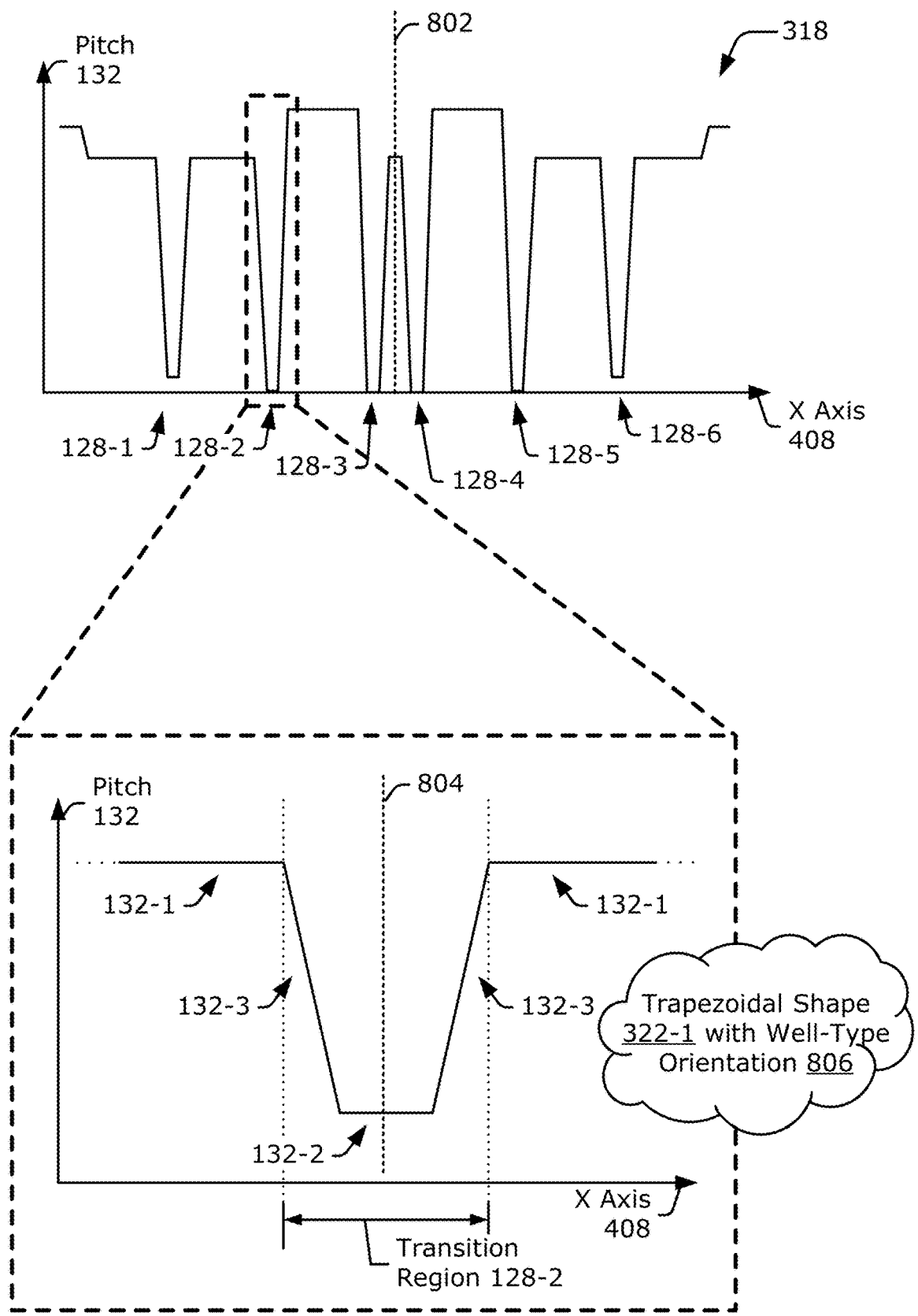
FIG. 8 illustrates an example pitch profile of a double-mode surface-acoustic-wave filter.

FIG. 8 illustrates an example pitch profile 318 of the double-mode surface-acoustic-wave filter 124 depicted in FIG. 7. The pitch profile 318 depicts the pitch 132 between different pairs of adjacent fingers 312 across the interdigital transducers 126-1 to 126-7. The different pairs of adjacent fingers 312 correspond to different positions along the first axis 408. In this example, the pitch 132 is partly uniform within the transition regions 128-1 to 128-6. In some implementations, the pitch profile 318 is approximately symmetrical across an axis of symmetry 802, as shown at the top of FIG. 8.

Consider the transition region 128-2, which is also depicted at the bottom of FIG. 8. In this case, a value of the pitch 132-2 across the first subset 604-1 of the second set of fingers 602-2 is less than a value of the pitch 132-1 across the first set of fingers 602-1. Also, a value of the pitch 132-3 varies between the value of the pitch 132-1 and the value of the pitch 132-2. In some implementations, the pitch 132 within the transition region 128 is substantially symmetrical about an axis of symmetry 804. In other words, slopes of the pitches 132-3 on each side of the transition region 128 are approximately equal in magnitude but opposite in sign. In other cases, the pitch 132 within the transition region 128 is not symmetrical.

In general, the pitch profile 318 within the transition region 128 has a trapezoidal shape 322-1. In this case, the trapezoidal shape 322-1 has a well-type orientation 806 because the value of the pitch 132-2 is less than the value of the pitch 132-1. The value of the pitch 132-2 can be between approximately 5% and 30% of the value of the pitch 132-1. In example implementations, the value the pitch 132-2 is between approximately 10% and 20% of the value of the pitch 132-1. In general, the term "approximately" can mean that the pitch 132-2 can be within ±2% of a specified value (e.g., within ±1.5%, ±1%, or ±0.5% of the specified value). A value of the pitch 132-2 can vary between different transition regions 128.

A difference between the pitches 132-1 and 132-2 can be based, at least in part, on a bandwidth of the double-mode surface-acoustic-wave filter 124. In general, double-mode surface-acoustic-wave filters 124 with larger bandwidths have a smaller difference between the values of the pitches 132-1 and 132-2.

In contrast, other double-mode surface-acoustic-wave filters can have a pitch profile with a triangular shape within the transition region. The triangular shape does not include a substantially uniform portion. This triangular shape may not enable the other double-mode surface-acoustic-wave filter to attenuate spurious modes within the passband using an aspect ratio that is within manufacturing process limits.

By having a partly uniform pitch 132 within the transition region 128, a velocity of the cavity mode increases at a higher rate than the velocity of another main wave mode of the double-mode surface-acoustic-wave filter 124. This enables at least a portion of the pitch 132 within the transition region 128 to be higher than the pitch associated with the triangular shape. This higher pitch enables the double-mode surface-acoustic-wave filter 124 to have an aspect ratio 324 that is within process limits.

Figure 9:
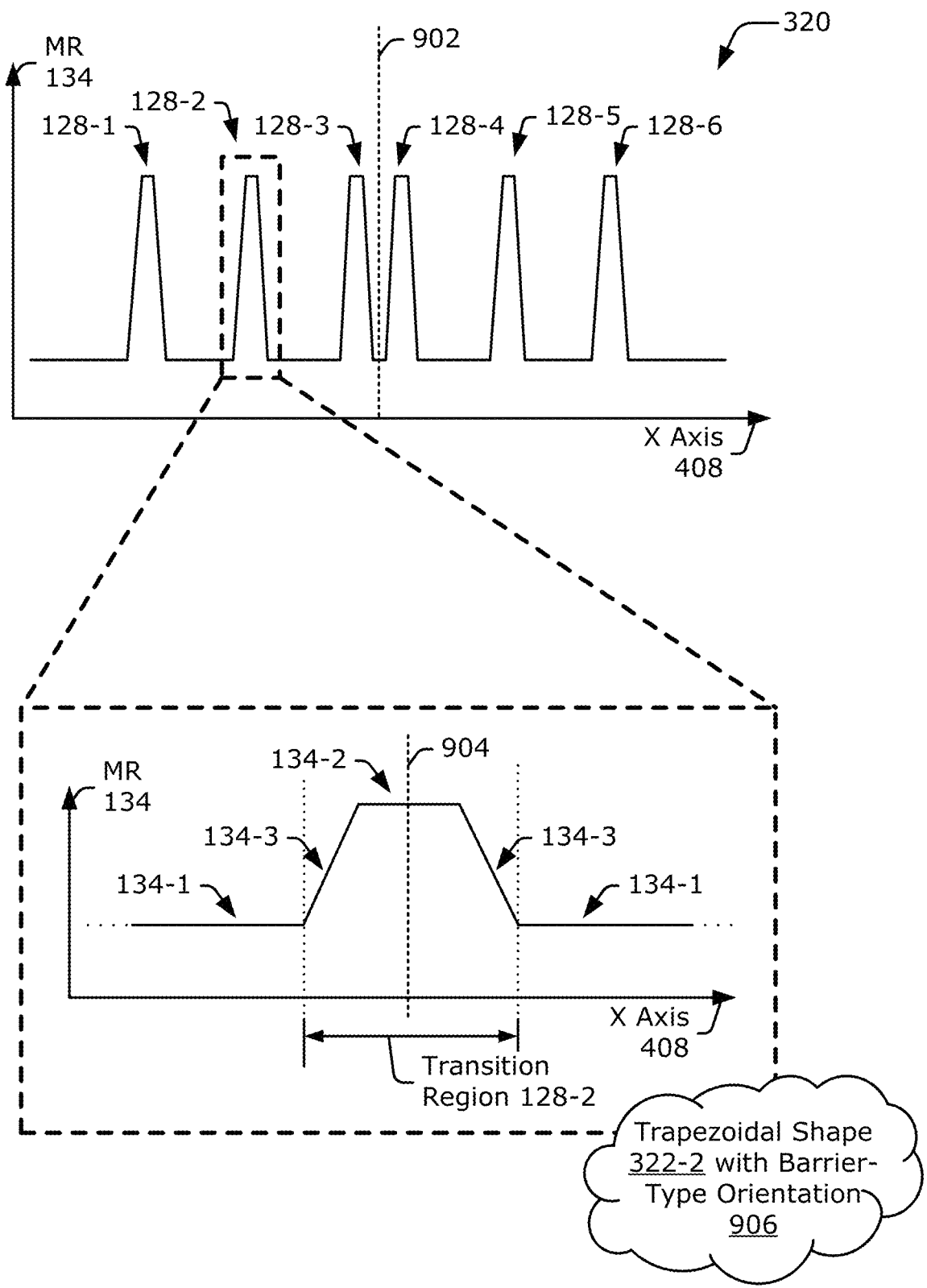
FIG. 9 illustrates an example metallization ratio profile of a double-mode surface-acoustic-wave filter.

FIG. 9 illustrates an example metallization ratio profile 320 of the double-mode surface-acoustic-wave filter 124 depicted in FIG. 7. The metallization ratio profile 320 depicts the metallization ratio 134 between different pairs of adjacent fingers 312 across the interdigital transducers 126-1 to 126-7. The different pairs of adjacent fingers 312 correspond to different positions along the first axis 408. In this example, the metallization ratio 134 is partly uniform within the transition regions 128-1 to 128-6. In some implementations, the metallization ratio profile 320 is approximately symmetrical across an axis of symmetry 902, as shown at the top of FIG. 9. The axis of symmetry 902 can also be the axis of symmetry 802 shown in FIG. 8.

Consider the transition region 128-2, which is also depicted at the bottom of FIG. 9. In this case, a value of the metallization ratio 134-2 across the first subset 604-1 of the second set of fingers 602-2 is greater than a value of the metallization ratio 134-1 across the first set of fingers 602-1. Also, a value of the metallization ratio 134-3 varies between the value of the metallization ratio 134-1 and the value of the metallization ratio 134-2. In some implementations, the metallization ratio 134 within the transition region 128 is substantially symmetrical about an axis of symmetry 904. In other words, slopes of the metallization ratios 134-3 on each side of the transition region 128 are approximately equal in magnitude but opposite in sign. In other implementations, the metallization ratio 134 within the transition region 128 is not symmetrical.

In general, the metallization ratio profile 320 within the transition region 128 has a trapezoidal shape 322-2. In this case, the trapezoidal shape 322-2 has a barrier-type orientation 906 because the value of the metallization ratio 134-2 is greater than the value of the metallization ratio 134-1. Although described with respect to a barrier-type orientation 906, other implementations of the double-mode surface-acoustic-wave filter 124 can have a metallization ratio profile 320 with a trapezoidal shape 322-2 having the well-type orientation 806. In other words, the trapezoidal shapes 322-1 and 322-2 of the pitch profile 318 and the metallization ratio profile 320 can have a similar orientation (e.g., both well-type orientations 806) or different orientations.

In general, the value of the metallization ratio 134-2 can be between approximately 50% and 150% of the value of the metallization ratio 134-1. For well-type orientations, the value of the metallization ratio 134-2 can be between approximately 50% and 100% of the value of the metallization ratio 134-1. In particular, the value of the metallization ratio 134-2 can be approximately equal to 50%, 75%, or 100% of the value of the metallization ratio 134-1. For barrier-type orientations, the value of the metallization ratio 134-2 can be between 100% and 150% of the value of the metallization ratio 134-1. In particular, the value of the metallization ratio 134-2 can be approximately equal to 100%, 125%, or 150% of the value of the metallization ratio 134-1. If the metallization ratio 134-2 is approximately equal to 100% of the value of the metallization ratio 134-1, the metallization ratio profile 320 can be considered to have a substantially flat shape instead of the trapezoidal shape 322.

In an example implementation, the value of the metallization ratio 134-2 is between approximately 103% and 105% of the value of the metallization ratio 134-1. For instance, the value of the metallization ratio 134-2 can be approximately equal to 103%, 104%, or 105%. In general, the term "approximately" can mean that the metallization ratio 134-2 can be within ±2% of a specified value (e.g., within ±1.5%, ±1%, or ±0.5% of the specified value). A value of the metallization ratio 134-2 can vary between different transition regions 128.

In general, the value of the metallization ratio 134-2 within the transition region 128 can be chosen to enable suppression of a spurious mode that impacts (or is close in frequency to) the cavity mode. The value of the metallization ratio 134-1 within the central region 502 can be chosen to enable suppression of a spurious mode that impacts (or is close in frequency to) the main wave mode. With both of the metallization ratios 134-1 and 134-2 designed for spurious mode suppression, the double-mode surface-acoustic-wave filter can have a relatively smooth passband.

Values of the metallization ratios 134-1 and 134-2 can vary based on a passband of the double-mode surface-acoustic-wave filter 124. For a passband that includes frequency bands 20 and 28, for instance, the metallization ratio 134-1 can be approximately 0.52 and the metallization ratio 134-2 can be approximately 0.54. With the described pitch profile 318 and/or metallization ratio profile 320, the double-mode surface-acoustic-wave filter 124 can achieve a relatively smooth passband using an aspect ratio 324 within process limits.

In contrast, other double-mode surface-acoustic-wave filters can have a metallization ratio profile with a triangular shape within the transition region. The triangular shape does not include a substantially uniform portion. This triangular shape may not enable the other double-mode surface-acoustic-wave filter to attenuate spurious modes using an aspect ratio that is within manufacturing process limits.

In general, the partly uniform metallization ratio 134 within the transition region 128 facilitates suppression of a spurious mode, such as a spurious Rayleigh mode, within the passband. At least a portion of the metallization ratio 134 within the transition region 128 can be lower than the metallization ratio associated with the triangular shape. In some cases, this lower metallization ratio 134 enables the double-mode surface-acoustic-wave filter 124 to have an aspect ratio 324 that satisfies process limits.

FIG. 10 is a flow diagram illustrating an example process 1000 for manufacturing a double-mode surface-acoustic-wave filter having a transition region with a partly uniform geometric property. The process 1000 is described in the form of a set of blocks 1002 and 1004 that specify operations that can be performed. However, operations are not necessarily limited to the order shown in FIG. 10 or described herein, for the operations may be implemented in alternative orders or in fully or partially overlapping manners. Also, more, fewer, and/or different operations may be implemented to perform the process 1000, or an alternative process. Operations represented by the illustrated blocks of the process 1000 may be performed to manufacture a double-mode surface-acoustic-wave filter 124 (e.g., of FIG. 1, 4-1, 4-2, or 7). More specifically, the operations of the process 1000 may be performed, at least in part, to manufacture one or more interdigital transducers 126 (e.g., of FIG. 3, 5, 6, or 7).

At 1002, a first set of fingers of at least one interdigital transducer of the double-mode surface-acoustic-wave filter is provided. The first set of fingers have a geometric property. For example, the manufacturing process provides the first set of fingers 602-1 of at least one interdigital transducer 126 of the double-mode surface-acoustic-wave filter 124, as shown in FIG. 6. The first set of fingers 602-1 has the geometric property 130, which can include the pitch 132-1, the metallization ratio 134-1, or both. The first set of fingers 602-1 can be associated with the central region 502.

At 1004, a second set of fingers of the at least one interdigital transducer of the double-mode surface-acoustic-wave filter is provided. The second set of fingers is positioned adjacent to the first set of fingers and is associated with an outer edge of the at least one interdigital transducer. The geometric property across a subset of the second set of fingers is substantially uniform. A value of the geometric property across the subset of the second set of fingers is different than a value of the geometric property across the first set of fingers.

For example, the manufacturing process provides the second set of fingers 602-2 of the at least one interdigital transducer 126 of the double-mode surface-acoustic-wave filter 124, as shown in FIG. 6. The second set of fingers 602-2 is positioned adjacent to the first set of fingers 602-1 and is associated with an outer edge of the at least one interdigital transducer 126. The geometric property 130 across the first subset 604-1 of the second set of fingers 602-2 is substantially uniform (e.g., varies by less than ±1%). A value of the geometric property 130 across the first subset 604-1 of the second set of fingers 602-2 is different than the value of the geometric property 130 across the first set of fingers 602-1. For instance, the pitch 132-2 is substantially uniform and has a different value than the pitch 132-1. Additionally or alternatively, the metallization ratio 134-2 is substantially uniform and has a different value than the metallization ratio 134-1. The second set of fingers 602-2 are associated with the transition region 128, as shown in FIG. 6.

Some aspects are described below.

Aspect 1: An apparatus comprising:
a double-mode surface-acoustic-wave filter comprising:
at least one interdigital transducer comprising multiple fingers, the multiple fingers comprising:
a first set of fingers having a geometric property; and
a second set of fingers positioned adjacent to the first set of fingers and associated with an outer edge of the at least one interdigital transducer, the geometric property across a subset of the second set of fingers being substantially uniform, a value of the geometric property across the subset of the second set of fingers being different than a value of the geometric property across the first set of fingers.

Aspect 2: The apparatus of aspect 1, wherein the subset of the second set of fingers comprises at least three fingers of the multiple fingers.

Aspect 3: The apparatus of any previous aspect, wherein the geometric property across the subset of the second set of fingers is substantially uniform such that the value of the geometric property across the subset of the second set of fingers changes by less than ±1%.

Aspect 4: The apparatus of any previous aspect, wherein:
the subset of the second set of fingers comprises a first subset of fingers;
the second set of fingers comprises a second subset of fingers positioned between the first set of fingers and the first subset of fingers; and
the geometric property across the second subset of fingers incrementally increases or decreases between the value of the geometric property across the first set of fingers and the value of the geometric property across the first subset of fingers.

Aspect 5: The apparatus of any previous aspect, wherein:
the geometric property comprises a pitch; and
a value of the pitch across the subset of the second set of fingers is less than a value of the pitch across the first set of fingers.

Aspect 6: The apparatus of aspect 5, wherein the pitch represents an average distance between adjacent fingers.

Aspect 7: The apparatus of aspect 5 or 6, wherein the value of the pitch across the subset of the second set of fingers is between approximately 5% and 30% of the value of the pitch across the first set of fingers.

Aspect 8: The apparatus of aspect 7, wherein the value of the pitch across the subset of the second set of fingers is between approximately 10% and 20% of the value of the pitch across the first set of fingers.

Aspect 9: The apparatus of any previous aspect, wherein:
the geometric property comprises a metallization ratio; and
a value of the metallization ratio across the subset of the second set of fingers is greater than a value of the metallization ratio across the first set of fingers.

Aspect 10: The apparatus of aspect 9, wherein the metallization ratio represents an average width of adjacent fingers divided by an average distance between the adjacent fingers.

Aspect 11: The apparatus of aspect 9 or 10, wherein a value of the metallization ratio across the subset of the second set of fingers is between approximately 50% and 150% a value of the metallization ratio across the first set of fingers.

Aspect 12: The apparatus of aspect 11, wherein the value of the metallization ratio across the subset of the second set of fingers is approximately 103% and 105% of the value of the metallization ratio across the first set of fingers.

Aspect 13: The apparatus of any previous aspect, wherein an aspect ratio of the at least one interdigital transducer is approximately 50% or less based on a value of the geometric property across the subset of the second set of fingers.

Aspect 14: The apparatus of any previous aspect, wherein:
multiple fingers of the at least one interdigital transducer comprise a third set of fingers positioned adjacent to the first set of fingers and associated with another outer edge of the at least one interdigital transducer;
the geometric property across a subset of the third set of fingers is substantially uniform; and
a value of the geometric property across the subset of the third set of fingers is different than the value of the geometric property across the first set of fingers.

Aspect 15: The apparatus of aspect 14, wherein the value of the geometric property across the subset of the third set of fingers is substantially similar to the value of the geometric property across the subset of the second set of fingers.

Aspect 16: The apparatus of aspect 14, wherein the value of the geometric property across the subset of the third set of fingers is different than the value of the geometric property across the subset of the second set of fingers.

Aspect 17: The apparatus of any previous aspect, wherein:
the at least one interdigital transducer comprises two adjacent interdigital transducers; and
the subset of the second set of fingers of each of the two adjacent interdigital transducers are positioned proximate to each other.

Aspect 18: The apparatus of any previous aspect, wherein:
the double-mode surface-acoustic-wave filter comprises:
an input port; and
an output port;
the at least one interdigital transducer comprises:
at least two first interdigital transducers each having:
a first busbar coupled to the input port; and
a second busbar coupled to ground; and
at least one second interdigital transducer interspersed between the at least two first interdigital transducers and having:
a first busbar coupled to the output port; and
a second busbar coupled to the ground.

Aspect 19: The apparatus of claim 18, wherein:
the at least two first interdigital transducers comprise four first interdigital transducers; and the at least one second interdigital transducer comprises three second interdigital transducers.

Aspect 20: The apparatus of any previous aspect, further comprising:
a wireless transceiver coupled to at least one antenna, the wireless transceiver comprising the double-mode surface-acoustic-wave filter and configured to filter, using the double-mode surface-acoustic-wave filter, a wireless signal communicated via the at least one antenna.

Aspect 21: A method of manufacturing a double-mode surface-acoustic-wave filter, the method comprising:
providing a first set of fingers of at least one interdigital transducer of the double-mode surface-acoustic-wave filter, the first set of fingers having a geometric property; and
providing a second set of fingers of the at least one interdigital transducer of the double-mode surface-acoustic-wave filter, the second set of fingers positioned adjacent to the first set of fingers and associated with an outer edge of the at least one interdigital transducer, the geometric property across a subset of the second set of fingers being substantially uniform, a value of the geometric property across the subset of the second set of fingers being different than a value of the geometric property across the first set of fingers.

Aspect 22: The method of aspect 21, wherein:
the geometric property comprises a pitch; and
a value of the pitch across the subset of the second set of fingers is between approximately 5% and 30% a value of the pitch across the first set of fingers.

Aspect 23: The method of aspect 21 or 22, wherein:
the geometric property comprises an metallization ratio; and
a value of the metallization ratio across the subset of the second set of fingers is between approximately 50% and 150% a value of the metallization ratio across the first set of fingers.

Aspect 24: An apparatus comprising:
a double-mode surface-acoustic-wave filter comprising at least two adjacent interdigital transducers, the at least two adjacent interdigital transducers comprising multiple fingers, a portion of the multiple fingers being positioned within a transition region of the double-mode surface-acoustic-wave filter,
wherein a profile of a geometric property across the portion of the multiple fingers has a trapezoidal shape.

Aspect 25: The apparatus of aspect 24, wherein the geometric property comprises at least one of the following:
a pitch; or
a metallization ratio.

Aspect 26: The apparatus of aspect 25, wherein:
the geometric property comprises the pitch; and
the trapezoidal shape has a barrier-type orientation.

Aspect 27: The apparatus of aspect 25 or 26, wherein:
the geometric property comprises the metallization ratio; and
the trapezoidal shape has a barrier-type orientation.

Aspect 28: An apparatus comprising:
a double-mode surface-acoustic-wave filter comprising:
two adjacent interdigital transducers, each interdigital transducer of the two adjacent interdigital transducers comprising multiple fingers, the multiple fingers of each interdigital transducer of the two adjacent interdigital transducers comprising:
a first set of fingers having a first pitch; and
a second set of fingers positioned adjacent to the first set of fingers and associated with an outer edge of the interdigital transducer, a subset of the second set of fingers having a second pitch that is substantially uniform, a value of the second pitch across the subset of the second set of fingers being less than a value of the first pitch across the first set of fingers,
wherein:
the second set of fingers of the two adjacent interdigital transducers are adjacent to each other; and
values of the second pitches associated with the two adjacent interdigital transducers are less than values of the first pitches associated with the two adjacent interdigital transducers.

Aspect 29: The apparatus of aspect 28, wherein:
the first set of fingers has a first metallization ratio;
the subset of the second set of fingers has a second metallization ratio that is substantially uniform; and
a value of the second metallization ratio across the subset of the second set of fingers of each interdigital transducer is greater than a value of the first metallization ratio across the first set of fingers of the interdigital transducer.

Aspect 30: The apparatus of aspect 29, wherein:
a profile of the second pitches across the second set of fingers of the two adjacent interdigital transducers has a trapezoidal shape with a well-type orientation; and
a profile of the second metallization ratios across the second set of fingers of the two adjacent interdigital transducers has another trapezoidal shape with a barrier-type orientation.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:
1. An apparatus comprising:
a double-mode surface-acoustic-wave filter comprising:
at least one interdigital transducer comprising multiple fingers, the multiple fingers comprising:
a first set of fingers having a geometric property; and
a second set of fingers positioned adjacent to the first set of fingers and associated with an outer edge of the at least one interdigital transducer, wherein each finger of the first set of fingers and the second set of fingers has a uniform width with respect to other fingers of the first set of fingers and the second set of fingers, the geometric property across a first subset of the second set of fingers being substantially uniform, a value of the geometric property across the first subset of the second set of fingers being different than a value of the geometric property across the first set of fingers, wherein the geometric property across a second subset of the second set of fingers incrementally increases or decreases between the value of the geometric property across the first subset of the second set of fingers and the value of the geometric property across the first set of fingers.

2. The apparatus of claim 1, wherein:
the geometric property comprises a pitch; and
a value of the pitch across at least one of the first subset or the second subset of the second set of fingers is less than a value of the pitch across the first set of fingers.

3. The apparatus of claim 2, wherein the value of the pitch across at least one of the first subset or the second subset of the second set of fingers is between approximately 5% and 30% of the value of the pitch across the first set of fingers.

4. The apparatus of claim 3, wherein the value of the pitch across at least one of the first subset or the second subset of the second set of fingers is between approximately 10% and 20% of the value of the pitch across the first set of fingers.

5. The apparatus of claim 2, wherein the pitch represents an average distance between adjacent fingers.

6. The apparatus of claim 1, wherein:
the geometric property comprises a metallization ratio; and
a value of the metallization ratio across at least one of the first subset or the second subset of the second set of fingers is greater than a value of the metallization ratio across the first set of fingers.

7. The apparatus of claim 6, wherein a value of the metallization ratio across at least one of the first subset or the second subset of the second set of fingers is between approximately 50% and 150% a value of the metallization ratio across the first set of fingers.

8. The apparatus of claim 7, wherein the value of the metallization ratio across at least one of the first subset or the second subset of the second set of fingers is approximately 103% and 105% of the value of the metallization ratio across the first set of fingers.

9. The apparatus of claim 6, wherein the metallization ratio represents an average width of adjacent fingers divided by an average distance between the adjacent fingers.

10. The apparatus of claim 1, wherein:
multiple fingers of the at least one interdigital transducer comprise a third set of fingers positioned adjacent to the first set of fingers and associated with another outer edge of the at least one interdigital transducer;
the geometric property across a subset of the third set of fingers is substantially uniform; and
a value of the geometric property across the subset of the third set of fingers is different than the value of the geometric property across the first set of fingers.

11. The apparatus of claim 10, wherein the value of the geometric property across the subset of the third set of fingers is substantially similar to the value of the geometric property across the subset of the second set of fingers.

12. The apparatus of claim 10, wherein the value of the geometric property across the subset of the third set of fingers is different than the value of the geometric property across at least one of the first subset or the second subset of the second set of fingers.

13. The apparatus of claim 1, wherein:
the double-mode surface-acoustic-wave filter comprises:
an input port; and
an output port;
the at least one interdigital transducer comprises:
at least two first interdigital transducers each having:
a first busbar coupled to the input port; and
a second busbar coupled to ground; and
at least one second interdigital transducer interspersed between the at least two first interdigital transducers and having:
a first busbar coupled to the output port; and
a second busbar coupled to the ground.

14. The apparatus of claim 13, wherein:
the at least two first interdigital transducers comprise four first interdigital transducers; and
the at least one second interdigital transducer comprises three second interdigital transducers.

15. The apparatus of claim 1, wherein the first subset of the second set of fingers comprises at least three fingers of the multiple fingers.

16. The apparatus of claim 1, wherein the geometric property across the first subset of the second set of fingers is substantially uniform such that the value of the geometric property across the first subset of the second set of fingers changes by less than ±1%.

17. The apparatus of claim 1, wherein an aspect ratio of the at least one interdigital transducer is approximately 50% or less based on a value of the geometric property across at least one of the first subset or the second subset of the second set of fingers.

18. The apparatus of claim 1, wherein:
the at least one interdigital transducer comprises two adjacent interdigital transducers; and
the second set of fingers of each of the two adjacent interdigital transducers are positioned proximate to each other.

19. The apparatus of claim 1, further comprising:
a wireless transceiver coupled to at least one antenna, the wireless transceiver comprising the double-mode surface-acoustic-wave filter and configured to filter, using the double-mode surface-acoustic-wave filter, a wireless signal communicated via the at least one antenna.

20. An apparatus comprising:
a double-mode surface-acoustic-wave filter comprising at least two adjacent interdigital transducers, the at least two adjacent interdigital transducers comprising a first set of fingers having a geometric property and a second set of fingers including a first subset of fingers and a second subset of fingers, the second set of fingers being positioned within a transition region of the double-mode surface-acoustic-wave filter,
wherein each finger of the first set of fingers and the second set of fingers has a uniform width with respect to other fingers of the first set of fingers and the second set of fingers, and
wherein a profile of a geometric property across the second set of fingers has a trapezoidal shape based on a geometric property across a second subset of the second set of fingers incrementally increasing or decreasing between a value of the geometric property across the first subset of fingers of the second set of fingers and a value of the geometric property across the first set of fingers.

21. The apparatus of claim 20, wherein the geometric property comprises at least one of the following:
a pitch; or
a metallization ratio.

22. The apparatus of claim 21, wherein:
the geometric property comprises the pitch; and
the trapezoidal shape has a barrier-type orientation.
23. The apparatus of claim 21, wherein:
the geometric property comprises the metallization ratio; and
the trapezoidal shape has a barrier-type orientation.
24. An apparatus comprising:
a double-mode surface-acoustic-wave filter comprising:
two adjacent interdigital transducers, each interdigital transducer of the two adjacent interdigital transducers comprising multiple fingers, the multiple fingers of each interdigital transducer of the two adjacent interdigital transducers comprising:
a first set of fingers having a first pitch; and
a second set of fingers positioned adjacent to the first set of fingers and associated with an outer edge of each interdigital transducer, wherein each finger of the first set of fingers and the second set of fingers has a uniform width with respect to other fingers of the first set of fingers and the second set of fingers, a first subset of the second set of fingers having a second pitch that is substantially uniform, a value of the second pitch across the first subset of the second set of fingers being less than a value of the first pitch across the first set of fingers,
wherein:
the second set of fingers of each of the two adjacent interdigital transducers are adjacent to each other;
values of the second pitch associated with each of the two adjacent interdigital transducers are less than values of the first pitch associated with each of the two adjacent interdigital transducers; and
a value of a pitch across a second subset of the second set of fingers incrementally increases or decreases between the value of the second pitch across the first subset of the second set of fingers and the first pitch across the first set of fingers.
25. The apparatus of claim 24, wherein:
the first set of fingers has a first metallization ratio;
at least one of the first subset or the second subset of the second set of fingers has a second metallization ratio that is substantially uniform; and
a value of the second metallization ratio across at least one of the first subset or the second subset of the second set of fingers of each interdigital transducer is greater than a value of the first metallization ratio across the first set of fingers of each interdigital transducer.

26. The apparatus of claim 25, wherein:
a profile of the second pitch across the second set of fingers of each of the two adjacent interdigital transducers has a trapezoidal shape with a well-type orientation; and
a profile of the second metallization ratio across the second set of fingers of each of the two adjacent interdigital transducers has another trapezoidal shape with a barrier-type orientation.
27. A method of manufacturing a double-mode surface-acoustic-wave filter, the method comprising:
providing a first set of fingers of at least one interdigital transducer of the double-mode surface-acoustic-wave filter, the first set of fingers having a geometric property; and
providing a second set of fingers of the at least one interdigital transducer of the double-mode surface-acoustic-wave filter, the second set of fingers positioned adjacent to the first set of fingers and associated with an outer edge of the at least one interdigital transducer, wherein each finger of the first set of fingers and the second set of fingers has a uniform width with respect to other fingers of the first set of fingers and the second set of fingers, the geometric property across a first subset of the second set of fingers being substantially uniform, a value of the geometric property across the first subset of the second set of fingers being different than a value of the geometric property across the first set of fingers, wherein the geometric property across a second subset of the second set of fingers incrementally increases or decreases between the value of the geometric property across the first subset of the second set of fingers and the value of the geometric property across the first set of fingers.
28. The method of claim 27, wherein:
the geometric property comprises a pitch; and
a value of the pitch across at least one of the first subset or the second subset of the second set of fingers is between approximately 5% and 30% a value of the pitch across the first set of fingers.
29. The method of claim 27, wherein:
the geometric property comprises an metallization ratio; and
a value of the metallization ratio across at least one of the first subset or the second subset of the second set of fingers is between approximately 50% and 150% a value of the metallization ratio across the first set of fingers.

* * * * *